(12) United States Patent
Fujie et al.

(10) Patent No.: US 6,303,264 B1
(45) Date of Patent: *Oct. 16, 2001

(54) AGENT FOR REDUCING THE SUBSTRATE DEPENDENCE OF RESIST

(75) Inventors: Hirotoshi Fujie; Tohru Souki; Yukiko Uehara, all of Saitama (JP)

(73) Assignee: Wako Pure Chemical Industries, LTD, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/066,585

(22) Filed: Apr. 27, 1998

(30) Foreign Application Priority Data

Apr. 30, 1997 (JP) ................................. 9-126283
May 26, 1997 (JP) ................................. 9-151570

(51) Int. Cl.⁷ .............................. G03C 5/00; G03F 7/004
(52) U.S. Cl. ........................................ 430/270.1; 430/905
(58) Field of Search ............................... 430/270.1, 905

(56) References Cited

U.S. PATENT DOCUMENTS

| | | | | |
|---|---|---|---|---|
| 4,579,806 | * | 4/1986 | Schupp et al. | 430/280 |
| 5,070,001 | * | 12/1991 | Stahlhofen | 430/281 |

(List continued on next page.)

FOREIGN PATENT DOCUMENTS

| | | |
|---|---|---|
| 0 537 524 A1 | 4/1993 | (EP) . |
| 0 555 749 A1 | 8/1993 | (EP) . |
| 0 660 187 A1 | 6/1995 | (EP) . |
| 0 679 951 A1 | 11/1995 | (EP) . |
| 0 704 762 A1 | 4/1996 | (EP) . |
| 749046 | * 6/1996 | (EP) . |
| 0 780 732 A2 | 6/1997 | (EP) . |
| 1059563-A1 | * 12/2000 | (EP) ............................. G03F/7/004 |
| 58 149 042 A | 9/1983 | (JP) . |
| 61 219 951 A | 9/1986 | (JP) . |
| WO 94/01805 | 1/1994 | (WO) . |

OTHER PUBLICATIONS

Aldrich Catalog 1996–1997, (pp. 139, 444, 534, 758, 1056, 1181, 1352, 1432) pertaining to specific chemical structures which can be used as reducing agents i.e., succinimde, phthalimide, and diacetamide.*

Derwent WPI—Abstract of JP9006002 A

Derwent WPI—Abstract of JP9006003 A

Derwent WPI—Abstract of EP 749046 A (family of JP9–6001).

Derwent WPI—Abstract of EP 679951 A (family of JP8–15864 and JP8 262721)

*Primary Examiner*—Janet Baxter
*Assistant Examiner*—Yvette M. Clarke
(74) *Attorney, Agent, or Firm*—Armstrong, Westerman, Hattori, McLeland & Naughton, LLP

(57) ABSTRACT

This invention relates to a substrate dependence reducing agent useful as the constituent of a chemical amplified type resist composition used for production of semiconductor devices, etc., which comprises a compound containing in the molecule at least one structure in which at least one of the direct links of —NH— is directly bonded to at least one member selected from the group consisting of —C(=O)—, —C(=S)— and —SO₂—.

When a resist composition containing said agent is used on a special substrate such as a TIN substrate or a BPSG substrate as a resist material for exposure to deep UV or KrF excimer laser beams, the resist composition can give a good profile of pattern of quarter micron order without causing footing, while retaining high resolution ability and high sensitivity.

40 Claims, 3 Drawing Sheets

U.S. PATENT DOCUMENTS

| | | | |
|---|---|---|---|
| 5,314,782 | * | 5/1994 | Lazarus et al. .................. 430/165 |
| 5,585,220 | * | 12/1996 | Breyta et al. .................. 430/270.1 |
| 5,712,078 | * | 1/1998 | Huang et al. .................. 430/270.1 |
| 5,716,756 | * | 2/1998 | Pawlowski et al. ............. 430/270.1 |
| 5,780,206 | * | 7/1998 | Urano et al. .................. 430/325 |
| 5,789,136 | * | 8/1998 | Sato et al. .................. 430/270.1 |
| 5,789,612 | * | 8/1998 | Graiver et al. .................. 556/451 |
| 5,876,900 | * | 3/1999 | Watanabe et al. ............. 430/288.1 |
| 5,912,083 | * | 6/1999 | Jimu et al. .................. 428/448 |

* cited by examiner

RESIST FILM
SUBSTRATE

RESIST FILM
SUBSTRATE

US 6,303,264 B1

AGENT FOR REDUCING THE SUBSTRATE DEPENDENCE OF RESIST

BACKGROUND OF THE INVENTION

This invention relates to a substrate dependence reducing agent useful as the constituent of a chemical amplified type positive- or negative-working resist composition used for production of semiconductor devices, etc., a resist composition containing said agent, and a pattern formation process using the resist composition.

In place of a source of i-line light (365 nm), a KrF excimer laser having a shorter output wavelength of 248 nm has recently come to be used as a light source for exposure used in a lithography process because of a demand for ultramicrofabrication caused with an enhancement of the degree of integration of semiconductor devices. Consequently, conventional dissolution-inhibiting type resists which require exposure at several hundreds milli-joule have become unusable for, for example, the following reasons: no high energy can be obtained because the excimer laser is used in place of a mercury vapor lamp; and the resists strongly absorb light (namely, they are poor in transmittance) at 248 nm. Therefore, there have come to be used chemical amplified type resists which have a high transmittance even at 248 nm and permits pattern formation by exposure at several tens milli-joule.

The chemical amplified type resists, however, tend to be affected by a substrate because they have a reaction mechanism in which a dissolution-inhibiting compound such as an alkali-insoluble compound or an alkali-insoluble polymer becomes alkali-soluble owing to exposure energy during pattern formation, i.e., a two-step reaction mechanism in which an acid is generated from a photosensitive compound, on account of the exposure energy, and a chemical reaction is caused by the generated acid, so that the alkali-insoluble compound or polymer becomes alkali-soluble. That is, the decrease of the exposure dose enhances the influence of a subtle difference of the exposure dose in the boundary surface portion of the substrate and the influence of a basic substance and water which are released from the substrate. Therefore, in device production using the chemical amplified type resist, it becomes impossible to attain a good profile of pattern by using a special substrate (e.g. TiN, BPSG, etc.) which has been extraordinarily disadvantageous. Such substrate dependence is a serious problem.

For solving this problem, there have been proposed resist compositions containing an organic carboxylic acid (for example, JP-A 9-6001, JP-A 9-6002, JP-A 9-6003 and European Patent Laid-Open No. 679951), and it has been reported that the resist compositions improve a profile of pattern on a special substrate. These resist compositions containing an organic carboxylic acid, however, are disadvantageous in that since the organic carboxylic acid is utilized for causing a chemical reaction to reduce the substrate dependence, the resist compositions are strongly acidic and hence deteriorated in performance characteristics during storage. For alleviating this disadvantage, a basic compound should be added in an amount larger than that required for neutralizing the organic carboxylic acid, resulting in causing problems such as a sensitivity decrease, etc.

Accordingly, there is desired the development of a highly sensitive resist composition which gives a pattern with an excellent profile even on a special substrate and has an excellent storage stability and a satisfactory throughput.

SUMMARY OF THE INVENTION

In view of such conditions, a problem to be solved by the present invention is to provide a resist composition which gives a fine pattern with a good profile even on a special substrate in pattern formation using the resist composition as a chemical amplified type positive- or negative-working resist composition, has an excellent storage stability, and makes it possible to form a pattern with high sensitivity.

The present invention was made for solving the above problem and includes the following items.

(1) An agent for reducing the substrate dependence of a resist which comprises a compound containing in the molecule at least one structure in which at least one of the direct links of —NH— is directly bonded to at least one member selected from the group consisting of —C(=O)—, —C(=S)— and —SO$_2$—.

(2) A resist composition comprising a polymer capable of becoming alkali-soluble owing to the action of an acid, a compound capable of generating an acid upon irradiation with actinic radiation, a compound containing in the molecule at least one structure in which at least one of the direct links of —NH— is directly bonded to at least one member selected from the group consisting of —C(=O)—, —C(=S)— and —SO$_2$—, and a solvent capable of dissolving these three components.

(3) A resist composition comprising an alkali-soluble polymer, a compound capable of becoming alkali-soluble owing to the action of an acid, a compound capable of generating an acid upon irradiation with actinic radiation, a compound containing in the molecule at least one structure in which at least one of the direct links of —NH— is directly bonded to at least one member selected from the group consisting of —C(=O)—, —C(=S)— and —SO$_2$—, and a solvent capable of dissolving these four components.

(4) A resist composition comprising an alkali-soluble polymer, a compound capable of making the polymer difficultly alkali-soluble by crosslinking therewith owing to the action of an acid, a compound capable of generating an acid upon irradiation with actinic radiation, a compound containing in the molecule at least one structure in which at least one of the direct links of —NH— is directly bonded to at least one member selected from the group consisting of —C(=O)—, —C(=S)— and —SO$_2$—, and a solvent capable of dissolving these four components.

(5) A process for forming a pattern comprising a step of coating a semiconductor substrate with the resist composition described in any of the above items (2) to (4), a step of heating the coating to form a resist film, a step of exposing the resist film to radiation through a mask, and a step of developing the resist film with an alkali developing solution after heating the same if necessary.

DETAILED DESCRIPTION OF THE PREFERRED EMBODIMENTS

Figure 1:
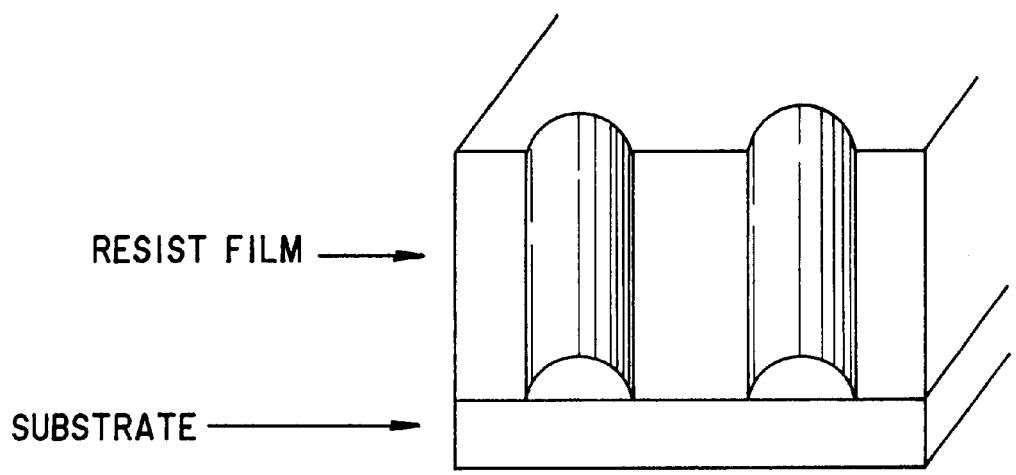
FIG. 1 is a cross-sectional view of a contact hole with a good profile obtained by using a resist composition containing a present invention's compound.

In order to obtain a chemical amplified type resist composition capable of giving a fine pattern with a good profile even on a special substrate, the present inventors earnestly investigated and consequently found that a compound containing in the molecule at least one structure in which at least one of the direct links of —NH— is directly bonded to at least one member selected from the group consisting of —C(=O)—, —C(=S)— and —SO$_2$— is markedly effective in avoiding the problem of the substrate dependence of conventional resist materials (namely, said compound is very effective as an agent for reducing the substrate dependence) and that a resist composition comprising said compound can achieve the above object. Thus, the present invention has been accomplished.

As the compound containing in the molecule at least one structure in which at least one of the direct links of —NH— is directly bonded to at least one member selected from the group consisting of —C(=O)—, —C(=S)— and —SO$_2$— (hereinafter abbreviated as the present invention's compound), there are cyclic compounds and acyclic compounds.

As the cyclic compounds usable in the present invention (hereinafter abbreviated as the present invention's compounds C), there can be exemplified by compounds represented by the following formula [1], [2] or [3]:

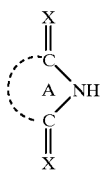

[1]

wherein X is an oxygen atom or a sulfur atom; and A is a saturated or unsaturated 5- or 6-membered ring which may contain an oxygen atom, a nitrogen atom or a sulfur atom as a constituent atom, and the carbon atoms constituting the ring may have a substituent;

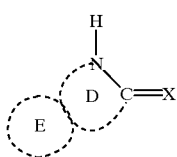

[2]

wherein X is an oxygen atom or a sulfur atom; D is a saturated or unsaturated 5- or 6-membered ring which may contain an oxygen atom, a nitrogen atom or a sulfur atom as a constituent atom, and the carbon atoms constituting the ring may have a substituent and the sulfur atom may have one or two oxo groups; and E is a saturated or unsaturated 6-membered ring or a fused ring, containing carbon atoms as constituent atoms, and the ring E is forming a fused ring with the ring D;

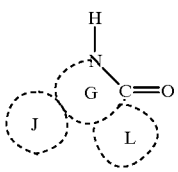

[3]

wherein G is a saturated or unsaturated 6- to 8-membered ring which may contain an oxygen atom as a constituent atom; and both J and L are independently a benzene ring, and the ring J and the ring L are independently forming a fused ring with the ring G.

In the formula [1], A is a saturated or unsaturated 5- or 6-membered ring which may contain an oxygen atom, a nitrogen atom or a sulfur atom as a constituent atom in addition to the carbon atoms and the nitrogen atom. The carbon atoms constituting the ring may have a substituent. The substituent on the carbon atom includes an alkyl group, an oxo group and an oxyimino group. The alkyl group may be either linear or branched. Preferable examples thereof are alkyl groups of 1 to 6 carbon atoms, such as methyl, ethyl, n-propyl, isopropyl, n-butyl, isobutyl, tert-butyl, sec-butyl, n-pentyl, isopentyl, tert-pentyl, 1-methylpentyl, n-hexyl and isohexyl.

In the formula [2], D is a saturated or unsaturated 5- or 6-membered ring which may contain an oxygen atom, a nitrogen atom or a sulfur atom as a constituent atom in addition to the carbon atom and the nitrogen atom. The carbon atoms constituting the ring may have a substituent. As the substituent on the carbon atom, there can be exemplified by an oxo group and a groups represented by the formula [4]:

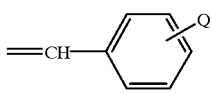

[4]

wherein Q is a hydrogen atom or an alkyl group.

In the formula [4], the alkyl group represented by Q may be either linear or branched. Preferable examples thereof are alkyl groups of 1 to 6 carbon atoms, such as methyl, ethyl, n-propyl, isopropyl, n-butyl, isobutyl, tert-butyl, sec-butyl, n-pentyl, isopentyl, tert-pentyl, 1-methylpentyl, n-hexyl and isohexyl.

The sulfur atom which constitutes the ring may have one or two oxo groups.

As the saturated or unsaturated 6-membered ring comprising carbon atoms as constituent atoms which is represented by E, there can be exemplified by a benzene ring, a cyclohexane ring, a cyclohexene ring, a cyclohexadiene ring, etc.

As the fused ring represented by E, there can be exemplified by a naphthalene ring, an anthracene ring, etc.

In the formula [3], G is a saturated or unsaturated 6- to 8-membered ring which may contain an oxygen atom as a constituent atom in addition to the carbon atom and the nitrogen atom. The ring G forms a fused ring with each of the benzene rings represented by J and L, respectively, on different sides of the ring G.

Specific examples of the present invention's compound C are compounds of the formula [1], including acid imide compounds derived from aliphatic dibasic acids, such as succinimide, maleimide and glutarimide, dimethadione, diethadione, rhodanine, hydantoin, uracil, dihydrouracil, 2,4-dioxohexahydro-1,3,5-triazine, parabanic acid, barbituric acid, alloxan, violuric acid, etc.; compounds of the formula [2], including acid imide compounds derived from aromatic dibasic acids, such as phthalimide, 1,2,3,6-tetrahydrophthalimide, 1,8-naphthalimide and 2,3-naphthalenedicarboximide, isatin, hydrocarbostyril, carbostyril, 1,4-benzoxazin-3-one, benzothiazin-3-one, oxinedole, 2-benzoxazolinone, 2-oxobenzo [c,d]indole, phthalimidine, 1-benzylphthalimidine, saccharin, benzoylene urea, etc.; compounds of the formula [3], including 6 (5H)-phenanthridinone, dihydrodibenzoxazepinone, 5,6,11,12-tetrahydrodibenz[b,f]azocin-6-one, etc.; compounds other than those represented by the formulae [1] to [3], including pyromellitic acid diimide and bentazone.

Of these, especially preferable examples of the present invention's compounds C are acid imide compounds such as succinimide and phthalimide, which can reduce the substrate dependence when added even in a small amount.

As the acyclic compounds usable in the present invention, there can be exemplified by sulfonamide derivatives (hereinafter abbreviated as the present invention's compounds A) and compounds represented by the formula [21]:

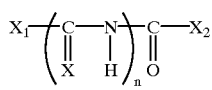

[21]

wherein $X_1$ and $X_2$ are independently a substituted or unsubstituted alkyl group or a phenyl group; n is an integer of 1 to 3; and X in a number of n are independently an oxygen atom or a sulfur atom (such compounds are hereinafter abbreviated as the present invention's compounds B).

As the present invention's compound A, there can be exemplified by compounds represented by the formula $R_0SO_2NHR'$ wherein $R_0$ is a substituted or unsubstituted alkyl group or a substituted or unsubstituted aryl group; and R' is a hydrogen atom or an alkyl group.

In the formula $R_0SO_2NHR'$, the alkyl group in the substituted or unsubstituted alkyl group represented by $R_0$ may be linear, branched or cyclic. Preferable examples thereof are alkyl groups of 1 to 6 carbon atoms, such as methyl, ethyl, n-propyl, isopropyl, cyclopropyl, n-butyl, isobutyl, tert-butyl, sec-butyl, n-pentyl, isopentyl, tert-pentyl, 1-methylpentyl, cyclopentyl, n-hexyl, isohexyl and cyclohexyl.

The substituent of the alkyl group includes a hydroxyl group, a halogen atom (e.g. chlorine, bromine, fluorine, iodine, etc.), an alkoxy group, etc. The alkoxy group may be either linear or branched. Preferable examples thereof are alkoxy groups of 1 to 6 carbon atoms, such as methoxy, ethoxy, n-propoxy, isopropoxy, n-butoxy, isobutoxy, tert-butoxy, sec-butoxy, n-pentyloxy, isopentyloxy, n-hexyloxy and isohexyloxy.

The aryl group in the substituted or un substituted aryl group represented by R include a phenyl group, a naphthyl group, etc.

The substituent of the aryl group includes a hydroxyl group, a halogen atom (e.g. chlorine, bromine, fluorine, iodine, etc.), an alkyl group, an alkoxy group, etc. The alkyl group may be linear, branched or cyclic. Preferable examples thereof are alkyl groups of 1 to 6 carbon atoms, such as methyl, ethyl, n-propyl, isopropyl, cyclopropyl, n-butyl, isobutyl, tert-butyl, sec-butyl, n-pentyl, isopentyl, tert-pentyl, 1-methylpentyl, cyclopentyl, n-hexyl, isohexyl and cyclohexyl. The alkoxy groups may be either linear or branched. Preferable examples thereof are alkoxy groups of 1 to 6 carbon atoms, such as methoxy, ethoxy, n-propoxy, isopropoxy, n-butoxy, isobutoxy, tert-butoxy, sec-butoxy, n-pentyloxy, isopentyloxy, n-hexyloxy and isohexyloxy.

In the formula $R_0SO_2NHR'$, the alkyl group represented by R' may be linear, branched or cyclic. Preferable examples thereof are alkyl groups of 1 to 6 carbon atoms, such as methyl, ethyl, n-propyl, isopropyl, cyclopropyl, n-butyl, isobutyl, tert-butyl, sec-butyl, n-pentyl, isopentyl, tert-pentyl, 1-methylpentyl, cyclopentyl, n-hexyl, isohexyl and cyclohexyl.

In the formula [21], the alkyl group in the substituted or unsubstituted alkyl group represented by each of $X_1$ and $X_2$ may be either linear or branched. Preferable examples thereof are alkyl groups of 1 to 10 carbon atoms, such as methyl, ethyl, n-propyl, isopropyl, n-butyl, isobutyl, tert-butyl, sec-butyl, n-pentyl, isopentyl, tert-pentyl, 1-methylpentyl, n-hexyl, isohexyl, heptyl, octyl, nonyl and decyl.

The substituent of the alkyl group includes a halogen atom (e.g. chlorine, bromine, fluorine, iodine, etc.), a nitro group, etc.

Specific examples of the compound of the formula $R_0SO_2NHR'$ are sulfonamides such as methanesulfonamide, p- or m-toluenesulfonamide and benzenesulfonamide. Of these, especially preferable examples of said compound are p- or m-toluenesulfonamide, benzenesulfonamide, etc.

Specific examples of the present invention's compound B are amides such as N-benzoylbenzamide and diacetamide; diacylurea derivatives such as diacetylurea, dipropionylurea and dibenzoylurea; and diacylthiourea derivatives such as diacetylthiourea, dipropionylthiourea and dibenzoylthiourea. Of these, especially preferable examples of the present invention's compound B are the amides such as N-benzoylbenzamide and diacetamide, which can reduce the substrate dependence when added even in a small amount.

The present invention's compounds are used singly or in proper combination of two or more thereof.

As the polymer capable of becoming alkali-soluble owing to the action of an acid which is used in the present invention, there can be exemplified by compounds represented by the following formula [5] or [6]:

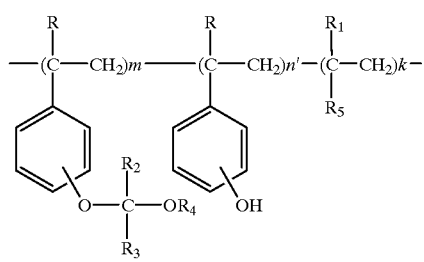

(5)

wherein R and $R_1$ are independently a hydrogen atom or a lower alkyl group; $R_2$ and $R_3$ are independently a hydrogen atom, an alkyl group which may be substituted by one or more halogen atoms, or an aryl group, except for the case where both $R_2$ and $R_3$ are hydrogen atoms, and $R_2$ and $R_3$ may form together an alkylene ring; $R_4$ is a an alkyl group which may be substituted by one or more halogen atoms, or an aralkyl group; $R_5$ is a cyano group, an esterified or non-esterified carboxyl group or a substituted or unsubstituted phenyl group; m and n' are independently a natural number; and k is zero or a natural number, provided that m>k.

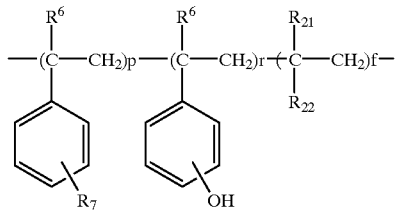

[6]

wherein $R_6$ is a hydrogen atom or a lower alkyl group; $R_7$ is a hydrogen atom, a lower alkyl group, a lower alkoxy group, an acyloxy group, a saturated heterocyclic oxy group, or a group represented by $R_8O$—CO—$(CH_2)z$—O— wherein $R_8$ is an alkyl group and z is zero or a natural number; $R_{21}$ is a hydrogen atom or a lower alkyl group; $R_{22}$ is a cyano group, an esterified or non-esterified carboxyl group, or a substituted or unsubstituted phenyl group, provided that in the case of $R_7$ being a hydrogen atom or a lower alkyl group, $R_{22}$ is an alkoxy group, a 5- or 6-membered saturated heterocyclic group or a substituted phenyl group having as the substituent a group represented by $R_{25}O$—CO—$(CH_2)jO$— wherein $R_{25}$ is a lower alkyl group and j is 0 or 1; p and r are independently a natural number; and f is zero or a natural number, provided that p>f.

The lower alkyl group represented by each of R and $R_1$ in the formula [5] and the lower alkyl group represented by each of $R_6$ and $R_{21}$ in the formula [6] independently may be either linear or branched and include alkyl groups of 1 to 6 carbon atoms, such as methyl, ethyl, n-propyl, isopropyl, n-butyl, isobutyl, tert-butyl, sec-butyl, n-pentyl, isopentyl, tert-pentyl, 1-methylpentyl, n-hexyl and isohexyl.

The alkyl group which may be substituted by one or more halogen atoms, represented by each of $R_2$, $R_3$ and $R_4$ in the formula [5], may be linear, branched or cyclic. Preferable examples thereof are alkyl groups of 1 to 10 carbon atoms, such as methyl, ethyl, n-propyl, isopropyl, cyclopropyl, n-butyl, isobutyl, tert-butyl, sec-butyl, n-pentyl, isopentyl, tert-pentyl, 1-methylpentyl, cyclopentyl, n-hexyl, isohexyl, cyclohexyl, heptyl, octyl, nonyl and decyl.

The halogen atom (s) in the alkyl group represented by each of $R_2$, $R_3$ and $R_4$ includes chlorine, bromine, fluorine, iodine, etc.

Preferable examples of the alkylene ring which $R_2$ and $R_3$ may form together are an alkylene ring having 3 to 6 carbon atoms, such as a propylene ring, a butylene ring, a pentylene ring and a hexylene ring.

The aralkyl group represented by $R_4$ includes, for example, a benzyl group, a phenethyl group, a phenylpropyl group, a methylbenzyl group, a methylphenethyl group, an ethylbenzyl group, etc.

In the formula [5], the esterified or non-esterified carboxyl group represented by $R_5$ includes a carboxyl group and a substituted carboxyl group having, for example, an alkyl group of 1 to 6 carbon atoms as the substituent for the hydrogen atom, such as a methyloxycarbonyl group, an ethyloxycarbonyl group, a propyloxycarbonyl group, a butyloxycarbonyl group, a pentyloxycarbonyl group and a hexyloxycarbonyl group.

The substituent of the substituted or unsubstituted phenyl group represented by $R_5$ includes, for example, halogen atoms such as chlorine, bromine, fluorine, iodine, linear, branched or cyclic alkyl groups of preferably 1 to 10 carbon atoms, such as methyl, ethyl, n-propyl, isopropyl, cyclopropyl, n-butyl, isobutyl, tert-butyl, sec-butyl, n-pentyl, isopentyl, tert-pentyl, 1-methylpentyl, cyclopentyl, n-hexyl, isohexyl, cyclohexyl, heptyl, octyl, nonyl and decyl; linear or branched alkoxy groups of preferably 1 to 6 carbon atoms, such as methoxy, ethoxy, n-propoxy, isopropoxy, n-butoxy, isobutoxy, tert-butoxy, sec-butoxy, n-pentyloxy, isopentyloxy, n-hexyloxy and isohexyloxy; linear, branched or cyclic acyl groups of 2 to 7 carbon atoms derived from carboxylic acids, such as acetyl, propionyl, n-butyryl, isobutyryl, n-pentanoyl, pivaloly, isovaleryl and cyclohexanecarbonyl; 5- to 6-membered saturated heterocyclic oxy groups such as tetrahydrofuranyloxy and tetrahydropyranyloxy; and groups represented by $R_{25}O$—CO—$(CH_2)jO$— wherein $R_{25}$ and j are as defined above. In this formula, the lower alkyl group represented by $R_{25}$ may be liner, branched or cyclic and includes alkyl groups of 1 to 6 carbon atoms, such as methyl, ethyl, n-propyl, isopropyl, cyclopropyl, n-butyl, isobutyl, tert-butyl, sec-butyl, cyclobutyl, n-pentyl, isopentyl, tert-pnetyl, 1-methylpentyl, cyclopentyl, n-hexyl, isohexyl and cyclohexyl. Specific examples of the groups represented by $R_{25}O$—CO—$(CH_2)jO$— are a methyloxycarbonyloxy group, an ethyloxycarbonyloxy group, an isopropyloxycarbonyloxy group, a tert-butyloxycarbonyloxy group, an isobutyloxycarbonyloxy group, a tert-pentyloxycarbonyloxy group, an ethyloxycarbonylmethyloxy group, a tert-butyloxycarbonylmethyloxy group, a 1-methylcyclopentyloxycarbonylmethyloxy group, a 1-methylcyclohexyloxycarbonylmethyloxy group, etc.

In the formula [6], preferable examples of the lower alkyl group represented by $R_7$ are linear or branched alkyl groups of 1 to 6 carbon atoms. Specific preferable examples thereof are an isopropyl group, an isobutyl group, a tert-butyl group, a sec-butyl group, an isopentyl group, a tert-pentyl group, a 1-methylpentyl group, an isohexyl group, etc.

Preferable examples of the lower alkoxy group represented by $R_7$ are linear or branched alkoxy groups of 1 to 6 carbon atoms, such as methoxy, ethoxy, n-propoxy, isopropoxy, n-butoxy, isobutoxy, tert-butoxy, sec-butoxy, n-pentyloxy, isopentyloxy, n-hexyloxy and isohexyloxy.

Preferable examples of the acyloxy group represented by $R_7$ are linear, branched or cyclic acyloxy groups of 2 to 7 carbon atoms derived from carboxylic acids, such as acetyloxy, propionyloxy, n-butyryloxy, isobutyryloxy, n-pentanoyloxy, pivaloyloxy, isovaleryloxy and cyclohexanecarbonyloxy.

The saturated heterocyclic oxy group represented by $R_7$ is preferably a 5- or 6-membered one and includes, for example, tetrahydrofuranyloxy group, tetrahydropyranyloxy group, etc.

As $R_8$ of the $R_8O$—CO—$(CH_2)z$—O— group represented by $R_7$, there can be exemplified by a linear, branched or cyclic alkyl groups of 1 to 10 carbon atoms, such as methyl, ethyl, n-propyl, isopropyl, cyclopropyl, n-butyl, isobutyl, tert-butyl, sec-butyl, n-pentyl, isopentyl, 1-methylcyclohexyl, tert-pentyl, 1-methylpentyl, cyclopentyl, n-hexyl, isohexyl, cyclohexyl, heptyl, octyl, nonyl and decyl. Specific examples of the $R_8O$—CO—$(CH_2)z$—O— group are a methyloxycarbonyloxy group, an ethyloxycarbonyloxy group, an isopropyloxycarbonyloxy group, an isobutyloxycarbonyloxy group, a tert-butyloxycarbonyloxy group, a tert-pentyloxycarbonyloxy group, a 1-methylcyclohexyloxycarbonylmethyloxy group, a tert-butyloxycarbonylmethyloxy group, a 1-methylcyclopentyloxycarbonylmethyloxy group, etc.

In the formula [6], the esterified or non-esterified carboxyl group represented by $R_{22}$ includes a carboxyl group and a substituted carboxyl groups having, for example, an alkyl group of 1 to 6 carbon atoms as the substituent for the hydrogen atom, such as a methyloxycarbonyl group, an ethyloxycarbonyl group, a propyloxycarbonyl group, a butyloxycarbonyl group, a pentyloxycarbonyl group and a hexyloxycarbonyl group.

The substituent of the substituted or unsubstituted phenyl group represented by $R_{22}$ includes, for example, halogen atoms such as chlorine, bromine, fluorine and iodine; linear, branched or cyclic alkyl groups of preferably 1 to 10 carbon atoms, such as methyl, ethyl, n-propyl, isopropyl, cyclopropyl, n-butyl, isobutyl, tert-butyl, sec-butyl, n-pentyl, isopentyl, tert-pentyl, 1-methylpentyl, cyclopentyl, n-hexyl, isohexyl, cyclohexyl, heptyl, octyl, nonyl and decyl; linear or branched alkoxy groups of preferably 1 to 6 carbon atoms, such as methoxy, ethoxy, n-propoxy, isopropoxy, n-butoxy, isobutoxy, tert-butoxy, sec-butoxy, n-pentyloxy, isopentyloxy, n-hexyloxy and isohexyloxy; linear, branched or cyclic acyl groups of 2 to 7 carbon atoms derived from carboxylic acids, such as acetyl, propionyl, n-butyryl, isobutyryl, n-pentanoyl, pivaloyl, isovaleryl and cyclohexanecarbonyl; 5- to 6-membered saturated heterocyclic oxy groups such as tetrahydrofuranyloxy and tetrahydropyranyloxy; and groups represented by $R_{25}O\text{---}CO\text{---}(CH_2)jO\text{---}$ wherein $R_{25}$ and $j$ are as defined above.

$R_{22}$ may be any of cyano group, the esterified or non-esterified carboxyl group or the substituted or unsubstituted phenyl group, though when $R_7$ is a hydrogen atom or a lower alkyl group, $R_{22}$ is an alkoxy group, a 5- or 6-membered saturated heterocyclic group or a substituted phenyl group having as the substituent a group represented by $R_{25}O\text{---}CO\text{---}(CH_2)jO\text{---}$ wherein $R_{25}$ is a lower alkyl group and $j$ is 0 or 1.

Specific examples of the compound of the formula [5] are poly[p-(1-methoxy-1-methylethoxy)-styrene/p-hydroxystyrene], poly[p-(1-benzyloxy-1-methylethoxy)styrene/p-hydroxystyrene], poly[p-(1-ethoxyethoxy)styrene/p-hydroxystyrene], poly[p-(1-methoxyethoxystyrene)/p-hydroxystyrene], poly[p-1-n-butoxyethoxystyrene/p-hydroxystyrene], poly[p-(1,1-dimethylethoxy)-1-methylethoxystyrene/p-hydroxystyrene], poly[p-(1-methoxy-1-methylethoxy)styrene/p-hydroxystyrene/styrene], poly[p-(1-methoxy-1-methylethoxy)styrene/p-hydroxystyrene/p-chlorostyrene], poly[p-(1-methoxy-1-methylethoxy)styrene/p-hydroxystyrene/p-methylstyrene], poly[p-(1-methoxy-1-methylethoxy)styrene/p-hydroxystyrene/p-methoxystyrene], poly[p-(1-methoxy-1-methylethoxy)styrene/p-hydroxystyrene/p-tert-butoxystyrene], poly[p-(1-methoxy-1-methylethoxy)styrene/p-hydroxystyrene/p-1-methylcyclohexyloxystyrene], poly[p-(1-methoxy-1-methylethoxy)styrene/p-hydroxystyrene/methyl methacrylate], poly[p-(1-methoxy-1-methylethoxy)styrene/p-hydroxystyrene/t-butyl methacrylate], poly[p-(1-methoxy-1-methylethoxy)styrene/p-hydroxystyrene/acrylonitrile], poly[p-(1-benzyloxy-1-methylethoxy)styrene/p-hydroxystyrene/styrene], poly[p-(1-benzyloxy-1-methylethoxy)styrene/p-hydroxystyrene/p-chlorostyrene], poly[p-(1-benzyloxy-1-methylethoxy)styrene/p-hydroxystyrene/p-methylstyrene], poly[p-(1-benzyloxy-1-methylethoxy)styrene/p-hydroxystyrene/p-ethoxystyrene], poly[p-(1-benzyloxy-1-methylethoxy)styrene/p-hydroxystyrene/p-tert-butoxystyrene], poly(p-1-ethoxyethoxystyrene/p-hydroxystyrene/styrene), poly(p-1-ethoxyethoxystyrene/p-hydroxystyrene/p-chlorostyrene), poly(p-1-ethoxyethoxystyrene/p-hydroxystyrene/p-methylstyrene), poly(p-1-ethoxyethoxystyrene/p-hydroxystyrene/m-methylstyrene), poly(p-1-ethoxyethoxystyrene/p-hydroxystyrene/methyl methacrylate), poly(p-1-ethoxyethoxystyrene/p-hydroxystyrene/cyclohexylmethacrylate), poly(p-1-ethoxyethoxystyrene/p-hydroxystyrene/tert-butyl methacrylate), poly(p-1-ethoxyethoxystyrene/p-hydroxystyrene/acrylonitrile), poly(p-1-ethoxyethoxystyrene/p-hydroxystyrene/p-methoxystyrene), poly(p-1-ethoxyethoxystyrene/p-hydroxystyrene/p-ethoxystyrene), poly(p-1-ethoxyethoxystyrene/p-hydroxystyrene/p-tert-butoxystyrene), poly(p-1-ethoxyethoxystyrene/p-hydroxystyrene/acrylic acid), poly(p-1-ethoxyethoxystyrene/p-hydroxystyrene/p-methoxycarbonyloxystyrene), poly(p-1-ethoxyethoxystyrene/p-hydroxystyrene/p-ethoxycarbonyloxystyrene), poly(p-1-ethoxyethoxystyrene/p-hydroxystyrene/p-isopropoxycarbonyloxystyrene), poly(p-1-methoxyethoxystyrene/p-hydroxystyrene/p-isobutyloxycarbonyloxystyrene), poly(p-1-ethoxyethoxystyrene/p-hydroxystyrene/p-isobutoxycarbonyloxystyrene), poly(p-1-ethoxyethoxystyrene/p-hydroxystyrene/p-isoamyloxycarbonyloxystyrene), poly(p-1-ethoxyethoxystyrene/p-hydroxystyrene/p-1-methylcyclohexyloxystyrene), poly(p-1-methoxyethoxystyrene/p-hydroxystyrene/styrene), poly(p-1-methoxyethoxystyrene/p-hydroxystyrene/p-methylstyrene), poly(p-1-methoxyethoxystyrene/p-hydroxystyrene/m-methylstyrene), poly(p-1-methoxyethoxystyrene/p-hydroxystyrene/p-chlorostyrene), poly(p-1-methoxyethoxystyrene/p-hydroxystyrene/p-methoxystyrene), poly(p-1-methoxyethoxystyrene/p-hydroxystyrene/p-ethoxystyrene), poly(p-1-methoxyethoxystyrene/p-hydroxystyrene/p-tert-butoxystyrene), poly(p-1-methoxyethoxystyrene/p-hydroxystyrene/p-1-methylcyclohexyloxystyrene), poly(p-1-methoxyethoxystyrene/p-hydroxystyrene/methyl methacrylate), poly(p-1-methoxyethoxystyrene/p-hydroxystyrene/tert-butyl methacrylate), poly(p-1-methoxyethoxystyrene/p-hydroxystyrene/acrylonitrile), poly(p-1-n-butoxyethoxystyrene/p-hydroxystyrene/p-n-butylstyrene), poly(p-1-isobutoxyethoxystyrene/p-hydroxystyrene/o-methoxystyrene), poly{p-[(1,1-dimethylethoxy)-1-methylethoxy]styrene/p-hydroxystyrene/m-methoxystyrene}, poly[p-(1,1-dimethylethoxy)-1-methylethoxystyrene/p-hydroxystyrene/o-methyistyrene], poly(p-1-ethoxyethoxystyrene/p-hydroxystyrene/p-acetoxystyrene), poly(p-1-ethoxyethoxystyrene/p-hydroxystyrene/p-pivaloyloxystyrene), poly(p-1-ethoxyethoxystyrene/p-hydroxystyrene/p-cyclohexanecarbonyloxystyrene), poly[m-1-(2-chloroethoxy)-ethoxystyrene/m-hydroxystyrene/styrene], poly[m-1-(2-ethylhexyloxy)ethoxystyrene/m-hydroxystyrene/m-methylstyrene], poly[p-(1-methoxy-1-methylethoxy)-α-methylstyrene/p-hydroxy-α-methylstyrene/styrene], poly[p-(1-ethoxy-1-methylethoxy)styrene/p-hydroxystyrene/p-methylstyrene], poly(p-1-n-propoxyethoxystyrene/p-hydroxystyrene/p-methoxystyrene), poly[p-(1-methyl-1-n-propoxyethoxy)styrene/p-hydroxystyrene/p-methylstyrene], poly(m-1-ethoxypropoxystyrene/m-hydroxystyrene/m-tert-butoxystyrene), poly(m-1-ethoxypropoxystyrene/m-hydroxystyrene/p-methylstyrene), poly[m-(1-methoxy-1-methylethoxy)styrene/m-hydroxystyrene/m-tert-butoxystyrene], poly[p-1-ethoxyethoxystyrene/p- hydroxystyrene/p-tetrahydrfranyloxystyrene], poly[p-1-ethoxyethoxystyrene/p-hydroxystyrene/p-tetrahydropyranyloxystyrene], poly[p-1-methoxyethoxystyrene/p-hydroxystyrene/p-tetrahydropyranyloxystyrene], poly[p-1-ethoxyethoxystyrene/p-hydroxystyrene/p-tert-butoxycarbonyloxystyrene], poly[p-1-methoxyethoxystyrene/p-hydroxystyrene/p-tert-butoxycarbonyloxystyrene], poly[p-(1-methoxy-1-methylethoxy)styrene/p-hydroxystyrene/p-tert-butoxycarbonyloxystyrene], poly(p-1-ethoxyethoxystyrene/p-hydroxystyrene/tert-butyl p-vinylphenoxyacetate), poly(p-1-methoxyethoxystyrene/p-hydroxystyrene/tert-butyl p-vinylphenoxyacetate), poly(p-1-methoxyethoxystyrene/p-hydroxystyrene/1-methylcyclohexyl p-vinylphenoxyacetate), poly[m-1-ethoxyethoxystyrene/m-hydroxystyrene/m-tert-butoxycarbonyloxystyrene], poly(m-1-ethoxyethoxystyrene/m-hydroxystyrene/m-tert-butoxystyrene), poly(m-1-methoxyethoxystyrene/m-hydroxystyrene/m-tert-butoxystyrene), poly(p-1-ethoxyethoxystyrene/m-1-ethoxyethoxystyrene/p-hydroxystyrene/m-hydroxystyrene/p-tert-butoxystyrene/m-tert-butoxystyrene), poly(p-1-methoxybutoxystyrene/p-hydroxystyrene/styrene), etc.

Specific examples of the compound of the formula [6] are poly(p-tert-butoxystyrene/p-hydroxystyrene), poly(1-methylcyclohexyloxystyrene/p-hydroxystyrene), poly(m-tert-butoxystyrene/m-hydroxystyrene), poly(p-methoxycarbonyloxystyrene/p-hydroxystyrene), poly(p-ethoxycarbonyloxystyrene/p-hydroxystyrene), poly(p-isopropoxycarbonyloxystyrene/p-hydroxystyrene), poly(p-isobutoxycarbonyloxystyrene/p-hydroxystyrene), poly(m-isobutoxycarbonyloxystyrene/m-hydroxystyrene), poly(p-tert-butoxycarbonyloxystyrene/p-hydroxystyrene), poly(m-tert-butoxycarbonyloxystyrene/p-hydroxystyrene), poly(p-isoamyloxycarbonyloxystyrene/p-hydroxystyrene), poly(m-isoamyloxycarbonyloxystyrene/m-hydroxystyrene), poly(p-tert-amyloxycarbonyloxystyrene/p-hydroxystyrene), poly(p-acetyloxystyrene/p-hydroxystyrene), poly(p-isobutyroyloxystyrene/p-hydroxystyrene), poly(p-pivaloyloxystyrene/p-hydroxystyrene), poly(p-cyclohexanecarbonyloxystyrene/p-hydroxystyrene), poly(p-sec-butoxycarbonyloxystyrene/p-hydroxystyrene), poly(p-tetrahydrofuranyloxystyrene/p-hydroxystyrene), poly(p-tetrahydropyranyloxystyrene/p-hydroxystyrene), poly(m-tetrahydropyranyloxystyrene/m-hydroxystyrene), poly(tert-butyl p-vinylphenoxyacetate/p-hydroxystyrene), poly(1-methylcyclohexyl p-vinylphenoxyacetate/p-hydroxystyrene), poly(styrene/p-hydroxystyrene/p-1-methoxyethoxystyrene), poly(p-methylstyrene/p-hydroxystyrene/p-1-methoxyethoxystyrene), poly(p-methoxystyrene/p-hydroxystyrene/p-1-methoxyethoxystyrene), poly(p-methylstyrene/p-hydroxystyrene/p-1-ethoxyethoxystyrene), poly(m-methylstyrene/p-hydroxystyrene/p-1-ethoxyethoxystyrene), poly(p-methoxystyrene/p-hydroxystyrene/p-1-ethoxyethoxystyrene), poly(p-tert-butylstyrene/p-hydroxystyrene/p-1-ethoxyethoxystyrene), poly(p-tert-butoxystyrene/p-hydroxystyrene/p-1-ethoxyethoxystyrene), poly(styrene/p-hydroxystyrene/p-1-methoxy-1-methylethoxystyrene), poly(p-methylstyrene/p-hydroxystyrene/p-1-methoxy-1-methylethoxystyrene), poly(p-methoxystyrene/p-hydroxystyrene/p-methoxy-1-methylethoxystyrene), poly(p-tert-butylstyrene/p-hydroxystyrene/p-methoxy-1-methylethoxystyrene), poly(p-tert-butoxystyrene/p-hydroxystyrene/p-1-methoxy-1-methylethoxystyrene), poly(styrene/p-hydroxystyrene/p-1-benzyloxyethoxystyrene), poly(p-methylstyrene/p-hydroxystyrene/p-1-benzyloxyethoxystyrene), poly(p-methoxystyrene/p-hydroxystyrene/p-1-benzyloxyethoxystyrene), poly(p-tert-butylstyrene/p-hydroxystyrene/p-1-benzyloxyethoxystyrene), poly(p-tert-butoxystyrene/p-hydroxystyrene/p-1-benzyloxyethoxystyrene), poly(p-ethoxycarbonyloxystyrene/p-hydroxystyrene/p-1-methoxyethoxystyrene), poly(p-ethoxycarbonyloxystyrene/p-hydroxystyrene/p-1-ethoxyethoxystyrene), poly(p-ethoxycarbonyloxystyrene/p-hydroxystyrene/p-1-methoxy-1-methylethoxystyrene), poly(p-tert-butoxycarbonyloxystyrene/p-hydroxystyrene/p-1-methoxyethoxystyrene), poly(p-tert-butoxycarbonyloxystyrene/p-hydroxystyrene/p-1-ethoxyethoxystyrene), poly(p-tert-butoxycarbonyloxystyrene/p-hydroxystyrene/p-1-methoxy-1-methylethoxystyrene), poly(p-tert-butoxycarbonyloxystyrene/p-hydroxystyrene/p-1-benzyloxyethoxystyrene), poly(p-acetyloxystyrene/p-hydroxystyrene/p-1-ethoxyethoxystyrene), poly(p-tetrahydropyranyloxystyrene/p-hydroxystyrene/p-1-methoxyethoxystyrene), poly(p-tetrahydropyranyloxystyrene/p-hydroxystyrene/p-1-ethoxyethoxystyrene), poly(p-tetrahydropyranyloxystyrene/p-hydroxystyrene/p-1-methoxy-1-methylethoxystyrene), poly(1-methylcyclohexyl p-vinylphenoxyacetate/p-hydroxystyrene/p-1-methoxyethoxystyrene), poly(1-methylcyclohexyl p-vinylphenoxyacetate/p-hydroxystyrene/p-1-ethoxyethoxystyrene), poly(1-methylcyclohexyl p-vinylphenoxyacetate/p-hydroxystyrene/p-1-methoxy-1-methylethoxystyrene), etc.

The alkali-soluble polymer used in the present invention includes, for example, poly(p-hydroxystyrene), poly(m-hydroxystyrene), poly(3-methyl-4-hydroxystyrene), poly(p-tert-butoxystyrene/p hydroxystyrene) [the number ratio of p-tert-butoxystyrene units to p-hydroxystyrene units is limited to 2 or less: 8 or more (such a ratio is hereinafter represented by 2↓:8↑)], poly(p-1-ethoxyethoxystyrene/p-hydroxystyrene) [the ratio of p-1-ethoxyethoxystyrene units to p-hydroxystyrene units is limited to 2↓:8↑], poly(p-tert-butoxycarbonyloxy-styrene/p-hydroxystyrene) [the ratio of p-tert-butoxy-carbonyloxystyrene units to p-hydroxystyrene units is limited to 2↓:8↑], poly(p-1-ethoxyethoxystyrene/p tert-butoxystyrene/p-hydroxystyrene) the ratio of the sum of p-1-ethoxyethoxystyrene units and p-tert-butoxystyrene units to p-hydroxystyrene units is limited to 2↓:8↑], poly(p-1-ethoxyethoxystyrene/styrene/p-hydroxystyrene) [the ratio of the sum of p-1-ethoxyethoxystyrene units and styrene units to p-hydroxystyreneunits is limited to 2↓:8↑], etc.

The compound capable of becoming alkali-soluble owing to the action of an acid which is used in the present invention includes, for example, alkali-insoluble compounds obtained by protecting at least a part or all of the phenolic hydroxyl group of an alkali-soluble compound with one or more of a tert-butoxycarbonyl group, a tert-butyl group, a 1-methoxyethyl group, a 1-ethoxyethyl group, a tetrahydropyranyl group, a 1-methylcyclohexyloxycarbonylmethyl group or the like. Specific examples thereof are 2,2-bis(4-tert-butyloxycarbonyloxyphenyl)propane, 2,2-bis(4-tert-butyloxyphenyl)propane, 2,2-bis (tetrahydropyranyloxyphenyl)propane, 2,2-bis [4-(1-methoxyethoxy)phenyl]propane, 2,2-bis[4-(1-ethoxyethyloxy)phenyl]propane, 2,2-bis[4-(1-methylcyclohexyloxycarbonylmethyloxy)phenylpropane], 1,1,2-tris(4-tert-butoxyphenyl)-2-methylpropane, 1,1,2-tris[4-(1-ethoxyethoxy)phenyl]-2-methylpropane, 1,1,2-tris(tert-butyloxycarbonyloxyphenyl)-2-methylpropane, etc.

As the compound capable of making the polymer hardly alkali-soluble by crosslinking therewith owing to the action of an acid which is used in the present invention, there can be exemplified by compounds represented by the formula [7]:

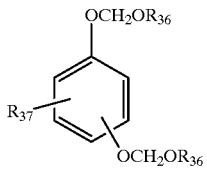

[7]

wherein $R_{36}$ is an alkyl group; and $R_{37}$ is a hydrogen atom or a group represented by the formula [8]:

[8]

wherein $R_{36}$ is as defined above, and compounds represented by the formula [9]:

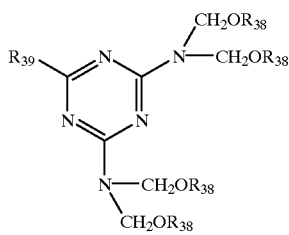

[9]

wherein $R_{38}$ is a hydrogen atom or an alkyl group; and $R_{39}$ is a hydrogen atom or a group represented by the formula [10]:

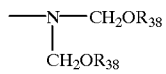

[10]

wherein $R_{38}$ is as defined above.

The alkyl group represented by $R_{36}$ in each of the formulae [7] and [8] and the alkyl group represented by $R_{38}$ in each of the formulae [9] and [10] may be linear, branched or cyclic. Preferable examples of each alkyl group are alkyl groups of 1 to 6 carbon atoms, such as methyl, ethyl, n-propyl, isopropyl, cyclopropyl, n-butyl, isobutyl, tert-butyl, sec-butyl, n-pentyl, isopentyl, tert-pentyl, 1-methylpentyl, cyclopentyl, n-hexyl, isohexyl and cyclohexyl.

Specific examples of the compound capable of making the polymer hardly alkali-soluble by cross-linking therewith owing to the action of an acid are 1,2,4-tris(cyclohexyloxymethoxy)benzene, 1,2,4-tris(isobutoxymethoxy)benzene, 1,2,4-tris(isopropoxymethoxy)benzene, 1,3,5-tris(cyclohexyloxymethoxy)benzene, 1,3,5-tris(isobutoxymethoxy)benzene, 1,3,5-tris(isopropoxymethoxy)benzene, 1,3-bis(cyclohexyloxymethoxy)benzene, 1,3-bis(isobutoxymethoxy)benzene, 1,3-bis(isopropoxymethoxy)benzene, 1,4-bis(cyclohexyloxymethoxy)benzene, 1,4-bis(isobutoxymethoxy)benzene, 1,4-bis(isopropoxymethoxy)benzene, 2,4,6-tris(N,N-dimethoxymethylamino)-1,3,5-triazine, 2,4-bis(N,N-dimethoxymethylamino)-1,3,5-triazine, etc.

The polymer capable of becoming alkali-soluble owing to the action of an acid, or the alkali-soluble polymer, which is used in the present invention, can be obtained by preparing a polymer by radical polymerization using an organic peroxide or an azo compound as a polymerization initiator or living polymerization using n-butyllithium or potassium naphthalenide, and subjecting the prepared polymer to a chemical reaction if necessary. The polymer capable of becoming alkali-soluble or the alkali-soluble polymer can easily be obtained, for example, by any of the processes disclosed in JP-A 4-211258, JP-A 5-194472, etc.

The weight-average molecular weight (Mw) of the polymer capable of becoming alkali-soluble owing to the action of an acid, or the alkali-soluble polymer, which is used in the present invention, is usually 3,000 to 50,000, preferably 5,000 to 30,000, as determined by a GPC method using a polystyrene as a standard. The dispersity (the ratio of weight-average molecular weight to number-average molecular weight) of the polymer is usually 1.00 to 3.00, preferably 1.02 to 2.00.

The polymer capable of becoming alkali-soluble owing to the action of an acid which is used in the present invention can easily be obtained, for example, by the process disclosed in JP-A 4-88348, etc.

The compound capable of making the polymer hardly alkali-soluble by crosslinking therewith owing to the action of an acid which is used in the present invention can easily be obtained, for example, by the process disclosed in JP-A 6-83055, etc.

As the acid generator used in the present invention, any acid generator may be used so long as it can generate an acid upon irradiation with actinic radiation and has no undesirable influence on the formation of a resist pattern. Especially preferable examples thereof are acid generators whose light transmittance near 248.4 nm is sufficiently high to maintain the high transparency of the resist material, or is sufficiently increased by light exposure to maintain the high transparency of the resist material. As such acid generators especially preferable in the present invention, there can be exemplified by compounds represented by the following formulae [11], [12], [14], [15], [16] and [18]:

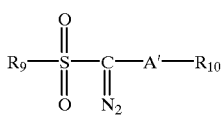

[11]

wherein $R_9$ and $R_{10}$ are independently an alkyl group or a haloalkyl group; and A' is a sulfonyl group or a carbonyl group.

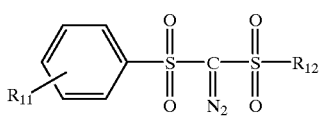

[12]

wherein $R_{11}$ is a hydrogen atom, a halogen atom, an alkyl group, an alkoxy group or a haloalkyl group; and $R_{12}$ is an alkyl group, a haloalkyl group or a group represented by the formula [13]:

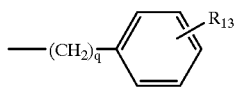

[13]

wherein $R_{13}$ is a hydrogen atom, a halogen atom, an alkyl group, an alkoxy group or a haloalkyl group; and q is zero or an integer of 1 to 3.

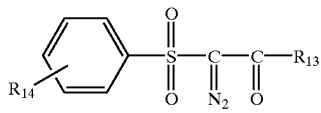

[14]

wherein $R_{14}$ is a hydrogen atom, a halogen atom, an alkyl group or a trifluorometlhyl group; and $R_{15}$ is an alkyl group, an aralkyl group, an alkoxy group, a phenyl group or a tolyl group.

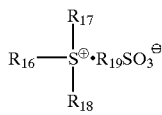

[15]

wherein $R_{16}$ is an alkyl group, an unsubstituted phenyl group, a substituted phenyl group or an aralkyl group; $R_{17}$ and $R_{18}$ are independently a hydrogen atom, an alkyl group, an unsubstituted phenyl group, a substituted phenyl group or an aralkyl group; and $R_{19}$ is a fluoroalkyl group, a trifluoromethylphenyl group, a methyl group or a tolyl group.

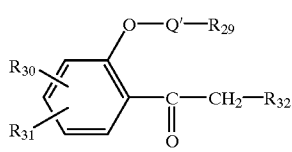

[16]

wherein $R_{29}$ is an alkyl group, a fluoroalkyl group, an unsubstituted phenyl group, a substituted phenyl group or an aralkyl group; Q' is a sulfonyl group or a carbonyl group; $R_{30}$ and $R_{31}$ are independently a hydrogen atom, a methyl group, a methoxy group, a nitro group, a cyano group, a hydroxyl group or a group represented by the formula [17]:

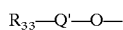

[17]

wherein $R_{33}$ is an alkyl group, a fluoroalkyl group, an unsubstituted phenyl group, a substituted phenyl group or an aralkyl group, and Q' is a sulfonyl group or a carbonyl group; and $R_{32}$ is a hydrogen atom, a methyl group or an ethyl group.

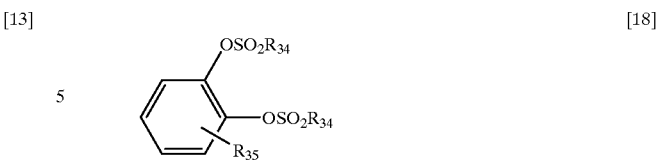

[18]

wherein $R_{34}$ is an alkyl group, a fluoroalkyl group, an unsubstituted phenyl group, a substituted phenyl group or an aralkyl group; and $R_{35}$ is a hydrogen atom, a methyl group, a fluoroalkyl group, a methoxy group, a nitro group, a cyano group, a hydroxyl group or a group represented by the above mentioned formula [17].

In the formula [11], the alkyl group represented by each of $R_9$ and $R_{10}$ or the alkyl group of the haloalkyl group represented by each of $R_9$ and $R_{10}$ may be linear, branched or cyclic. Preferable examples of each alkyl group are alkyl groups of 1 to 10 carbon atoms, such as methyl, ethyl, n-propyl, isopropyl, cyclopropyl, n-butyl, isobutyl, tert-butyl, sec-butyl, n-pentyl, isopentyl, tert-pentyl, 1-methylpentyl, cyclopentyl, n-hexyl, isohexyl, cyclohexyl, heptyl, octyl, nonyl and decyl.

The halogen of the haloalkyl group includes chlorine, bromine, fluorine, iodine, etc.

In the formula [12], the alkyl group represented by $R_{11}$ or the alkyl group of the haloalkyl group represented by $R_1$ may be either linear or branched. Preferable examples of each alkyl group are alkyl groups of 1 to 5 carbon atoms, such as methyl, ethyl, n-propyl, isopropyl, n-butyl, isobutyl, tert-butyl, sec-butyl, n-pentyl, isopentyl, tert-pentyl and 1-methylpentyl. The halogen atom represented by $R_{11}$ or the halogen of the haloalkyl group represented by $R_{11}$ includes chlorine, bromine, fluorine, iodine, etc. The alkoxy group represented by $R_{11}$ may be either linear or branched. Preferable examples thereof are alkoxy groups of 1 to 5 carbon atoms, such as methoxy, ethoxy, n-propoxy, isopropoxy, n-butoxy, isobutoxy, tert-butoxy, sec-butoxy, n-pentyloxy and isopentyloxy. The alkyl group represented by $R_{12}$ or the alkyl group of the baloalkyl group represented by $R_{12}$ may be linear, branched or cyclic. Preferable examples of each alkyl group are alkyl groups of 1 to 10 carbon atoms, such as methyl, ethyl, n-propyl, isopropyl, cyclopropyl, n-butyl, isobutyl, tert-butyl, sec-butyl, n-pentyl, isopentyl, tert-pentyl, 1-methylpentyl, cyclopentyl, n-hexyl, isohexyl, cyclohexyl, heptyl, octyl, nonyl and decyl. The halogen of the haloalkyl group includes chlorine, bromine, fluorine, iodine, etc.

In the formula [13], the alkyl group represented by $R_{13}$ or the alkyl group of the haloalkyl group represented by $R_{13}$ may be either linear or branched. Preferable examples of each alkyl group are alkyl groups of 1 to 6 carbon atoms, such as methyl, ethyl, n-propyl, isopropyl, n-butyl, isobutyl, tert-butyl, sec-butyl, n-pentyl, isopentyl, tert-pentyl, 1-methylpentyl, n-hexyl and isohexyl. The alkoxy group of 1 to 6 carbon atoms represented by $R_{13}$ may be either linear or branched. Preferable examples thereof are alkoxy groups of 1 to 5 carbon atoms, such as methoxy, ethoxy, n-propoxy, isopropoxy, n-butoxy, isobutoxy, tert-butoxy, sec-butoxy, n-pentyloxy, isopentyloxy, n-hexyloxy and isohexyloxy. The halogen atom represented by $R_{13}$ or the halogen of the haloalkyl group represented by $R_{13}$ includes chlorine, bromine, fluorine, iodine, etc.

In the formula [14], the alkyl group represented by $R_{14}$ may be either linear or branched. Preferable examples thereof are alkyl groups of 1 to 5 carbon atoms, such as methyl, ethyl, n-propyl, isopropyl, n-butyl, isobutyl, tert-butyl, sec-butyl, n-pentyl, isopentyl, tert-pentyl and 1-methylpentyl. The halogen atom represented by $R_{14}$ includes chlorine, bromine, fluorine, iodine, etc. The alkyl group represented by $R_{15}$ may be linear, branched or cyclic. Preferable examples thereof are alkyl groups of 1 to 10 carbon atoms, such as methyl, ethyl, n-propyl, isopropyl, cyclopropyl, n-butyl, isobutyl, tert-butyl, sec-butyl, n-pentyl, isopentyl, tert-pentyl, 1-methylpentyl, cyclopentyl, n-hexyl, isohexyl, cyclohexyl, heptyl, octyl, nonyl and decyl.

The aralkyl group represented by $R_{15}$ includes, for example, a benzyl group, a phenethyl group, a phenylpropyl group, a methylbenzyl group, a methylphenethyl group, an ethylbenzyl group, etc. The alkoxy group represented by $R_{15}$ may be either linear or branched and includes, for example, alkoxy groups of 1 to 6 carbon atoms, such as methoxy, ethoxy, n-propoxy, isopropoxy, n-butoxy, isobutoxy, tert-butoxy, sec-butoxy, n-pentyloxy, isopentyloxy, n-hexyloxy and isohexyloxy.

In the formula [15], the alkyl group represented by each of $R_{16}$, $R_{17}$ and $R_{18}$ may be linear, branched or cyclic. Preferable examples thereof are alkyl groups of 1 to 8 carbon atoms, such as methyl, ethyl, n-propyl, isopropyl, cyclopropyl, n-butyl, isobutyl, tert-butyl, sec-butyl, n-pentyl, isopentyl, tert-pentyl, 1-methylpentyl, cyclopentyl, n-hexyl, isohexyl, cyclohexyl, heptyl and octyl. The substituted phenyl group represented by each of $R_{16}$, $R_{17}$ and $R_{18}$ includes, for example, a tolyl group, an ethylphenyl group, a tert-butylphenyl group, a chlorophenyl group, etc. The aralkyl group represented by each of $R_{16}$, $R_{17}$ and $R_{18}$ includes, for example, a benzyl group, a phenethyl group, a phenylpropyl group, a methylbenzyl group, a methylphenethyl group, a ethylbenzyl group, etc. The alkyl group of the fluoroalkyl group represented by $R_{19}$ may be either linear or branched. Prerable examples thereof are alkyl groups of 1 to 8 carbon atoms, such as methyl, ethyl, n-propyl, isopropyl, n-butyl, isobutyl, tert-butyl, sec-butyl, n-pentyl, isopentyl, tert-pentyl, 1-methylpentyl, n-hexyl, isohexyl, heptyl and octyl. The total number of fluorine atoms as the substituents of the fluoroalkyl group is preferably 1 to 17.

In the formula [16], the alkyl group represented by $R_{29}$ may be linear, branched or cyclic. Preferable examples thereof are alkyl groups of 1 to 6 carbon atoms, such as methyl, ethyl, n-propyl, isopropyl, n-butyl, isobutyl, tert-butyl, sec-butyl, n-pentyl, isopentyl, cyclopentyl, n-hexyl and cyclohexyl. The substituted phenyl group represented by $R_{29}$ includes, for example, a tolyl group, an ethylphenyl group, a tert-butylphenyl group, a chlorophenyl group, etc. The aralkyl group represented by $R_{29}$ includes, for example, a benzyl group, a phenethyl group, a phenylpropyl group, a methylbenzyl group, a methylphenethyl group, an ethylbenzyl group, etc. The alkyl group of the fluoroalkyl group represented by $R_{29}$ may be either linear or branched. Preferable examples thereof are alkyl groups of 1 to 8 carbon atoms, such as methyl, ethyl, n-propyl, isopropyl, n-butyl, isobutyl, tert-butyl, sec-butyl, n-pentyl, isopentyl, n-hexyl, heptyl and octyl. The total number of fluorine atoms as the substituents of the fluoroalkyl group is preferably 1 to 17.

In the formula [17], the alkyl group represented by $R_{33}$ may be linear, branched or cyclic. Preferable examples thereof are alkyl groups of 1 to 6 carbon atoms, such as methyl, ethyl, n-propyl, isopropyl, n-butyl, isobutyl, tert-butyl, sec-butyl, n-pentyl, isopentyl, cyclopentyl, n-hexyl and cyclohexyl. The substituted phenyl group represented by $R_{33}$ includes, for example, a tolyl group, an ethylphenyl group, a tert-butylphenyl group, a chlorophenyl group, etc. The aralkyl group represented by $R_{33}$ includes, for example, a benzyl group, a phenethyl group, a phenylpropyl group, a methylbenzyl group, a methylphenethyl group and an ethylbenzyl group, etc. The alkyl group of the fluoroalkyl group represented by $R_{33}$ may be either linear or branched. Preferable examples thereof are alkyl groups of 1 to 8 carbon atoms, such as methyl, ethyl, n-propyl, isopropyl, n-butyl, isobutyl, tert-butyl, sec-butyl, n-pentyl, isopentyl, n-hexyl, heptyl and octyl. The total number of fluorine atoms as the substituents of the fluoroalkyl group is preferably 1 to 17.

In the formula [18], the alkyl group represented by $R_{34}$ may be linear, branched or cyclic. Preferable examples thereof are alkyl groups of 1 to 6 carbon atoms, such as methyl, ethyl, n-propyl, isopropyl, n-butyl, isobutyl, tert-butyl, sec-butyl, n-pentyl, isopentyl, cyclopentyl, n-hexyl and cyclohexyl. The substituted phenyl group represented by $R_{34}$ includes, for example, a tolyl group, an ethylphenyl group, a tert-butylphenyl group, a chlorophenyl group, etc. The aralkyl group represented by $R_{34}$ includes, for example, a benzyl group, a phenethyl group, a phenylpropyl group, a methylbenzyl group, a methylphenethyl group, an ethylbenzyl group, etc. The alkyl group of the fluoroalkyl group represented by each of $R_{34}$ and $R_{35}$ may be either linear or branched. Preferable examples thereof are alkyl groups of 1 to 8 carbon atoms, such as methyl, ethyl, n-propyl, isopropyl, n-butyl, isobutyl, tert-butyl, sec-butyl, n-pentyl, isopentyl, n-hexyl, heptyl and octyl. The total number of fluorine atoms as the substituents of the fluoroalkyl group is preferably 1 to 17.

Specific preferable examples of the acid generator used in the present invention are as follows:

The acid generators of the formula [11] include, for example, 1-cyclohexylsulfonyl-1-(1,1-dimethylethylsulfonyl)diazomethane, bis(1,1-dimethylethylsulfonyl)diazomethane, bis(1-methylethylsulfonyl)diazomethane, bis(cyclohexylsulfonyl) diazomethane, 1-cyclohexylsulfonyl-1-cyclohexylcarbonyldiazomethane, 1-diazo-1-cyclohexylsulfonyl-3,3-dimethylbutan-2-one, 1-diazo-1-methylsulfonyl-4-phenylbutan-2-one, 1-diazo-1-(1,1-dimethylethylsulfonyl)-3,3-dimethyl-2-butanone, 1-acetyl-1-(1-methylethylsulfonyl)diazomethane, etc.

The acid generators of the formula [12] include, for example, bis(p-toluenesulfonyl)diazomethane, bis(2,4-dimethylbenzenesulfonyl)diazomethane, methylsulfonyl-p-toluenesulfonyldiazomethane, bis(p-tert-butylphenylsulfonyl)diazomethane, bis(p-chlorobenzenesulfonyl)diazomethane, cyclohexylsulfonyl-p-toluenesulfonyldiazomethane, etc.

The acid generators of the formula [14] include, for example, 1-p-toluenesulfonyl-1-cyclohexylcarbonyldiazomethane, 1-diazo-1-(p-toluenesulfonyl)-3,3-dimethylbutan-2-one, 1-diazo-1-benzenesulfonyl-3,3-dimethylbutan-2-one, 1-diazo-1-(p-toluenesulfonyl)-3-methylbutan-2-one, etc.

The acid generators of the formula [15] include, for example, triphenylsulfonium.trifluoromethanesulfonate, triphenylsulfonium.perfluorooctanesulfonate, diphenyl-p-tolylsulfonium.perfluorooctanesulfonate, tris(p-tolyl) sulfonium.perfluorooctanesulfonate, tris(p-chlorobenzene) sulfonium.trifluoromethanesulfonate, tris(p-tolyl) sulfonium.trifluoromethanesulfonate, trimethylsulfonium.trifluoromethanesulfonate, dimethylphenylsulfonium.trifluoromethanesulfonate, dimethyl-p-tolylsulfonium.trifluoromethanesulfonate, dimethyl-p-tolylsulfonium.perfluorooctanesulfonate, etc.

The acid generators of the formula [16] include, for example, 2,6-di-trifluoromethanesulfonyloxyacetophenone, 2,6-di-trifluoromethanesulfonyloxy-propiophenone, 2,3,4-tris-trifluoromethanesulfonyloxyacetophenone, 2,6-di-methanesulfonyloxyacetophenone, 2,6-di-methanesulfonyloxypropiophenone, 2,3,4-tris-methanesulfonyloxyacetophenone, 2-trifluoromethanesulfonyloxyacetophenone, 2-methanesulfonyloxyacetophenone, 2-n-butanesulfonyloxyacetophenone, 2,6-di-n-butanesulfonyloxyacetophenone, 2,3,4-tris-n-butanesulfonyloxyacetophenone, 2,6-di-perfluoropropanecarboxyacetophenone, 2,3,4-tris-perfluoropropanecarboxyacetophenone, 2,6-di-p-toluenesulfonyloxyacetophenone, 2,6-di-p-toluenesulfonylpropiophenone, 2,6-di-trifuoroacetyloxyacetophenone, 2-trifluoroacetyloxy-6-methoxyacetophenone, 6-hydroxy-2-perfluorobutanesulfonyloxyacetophenone, 2-trifluoroacetyloxy-6-nitroacetophenone, 2,3,4-tris-trifluoroacetyloxyacetophenone, 2,6-di-perfluoropropanoyloxyacetophenone, etc.

The acid generators of the formula [18] include, for example, 1,2,3-tris-methanesulfonyloxybenzene, 1,2,3-tris-p-toluenesulfonyloxybenzene, 1,2,3-tris-trifluoromethanesulfonyloxybenzene, 1,2,3-tris-perfluorobutanesulfonyloxybenzene, 1,2,3-tris-cyclohexylsulfonyloxybenzene, 1,2-di-methanesulfonyloxy-3-nitrobenzene, 2,3-di-methanesulfonyloxyphenol, 1,2,4-tris-p-toluenesuffonyloxybenzene, 1,2,4-tris-methanesulfonyloxybenzene, 1,2,4-tris-triuoromethanesulfonyloxybenzene, 1,2,4-tris-cyclohexylsulfonyloxybenzene, 1,2-di-n-butanesulfonyloxy-3-nitrobenzene, 1,2,3-tris-perfluorooctanesulfonyloxybenzene, 1,2-di-perfluorobutanesulfonyloxyphenol, etc.

The acid generator used in the present invention can easily be obtained, for example, by any of the processes disclosed in JP-A 4-210960, JP-A 4-211258, JP-A 5-249682, etc.

In the resist compositions of the present invention, an amount of the present invention's compound to be used is usually 0.01 to 10 parts by weight, preferably 0.1 to 1.0 part by weight relative to 100 parts by weight of (a) the polymer capable of becoming alkali-soluble owing to the action of an acid (hereinafter abbreviated as polymer component (i)), (b) the sum of the alkali-soluble polymer and the compound capable of becoming alkali-soluble owing to the action of an acid (this sum is hereinafter abbreviated as polymer component (ii) ) or (c) the sum of the alkali-soluble polymer and the compound capable of making the polymer hardly alkali-soluble by crosslinking therewith owing to the action of an acid (this sum is hereinafter abbreviated as polymer component (iii)).

When the compound capable of becoming alkali-soluble owing to the action of an acid or the compound capable of making the polymer hardly alkali-soluble by crosslinking therewith owing to the action of an acid is used together with the alkali-soluble polymer in the resist compositions of the present invention, an amount of the compound to be used is usually 10 to 50 parts by weight, preferably 15 to 40 parts by weight relative to 100 parts by weight of the alkali-soluble polymer.

An amount of the acid generator to be used in the resist compositions of the present invention is usually 1 to 30 parts by weight, preferably 1 to 20 parts by weight relative to 100 parts by weight of polymer component (i), polymer component (ii) or polymer component (iii) .

In the present invention, any solvent may be used so long as it can dissolve any of the above-mentioned polymer components (i) to (ii), the acid generator and the present invention's compound. Usually, solvents having good film-forming properties are preferably used. Specific preferable examples of the solvent are methyl Cellosolve acetate, ethyl Cellosolve acetate, propylene glycol monomethyl ether acetate, propylene glycol monoethyl ether acetate, ethyl lactate, methyl pyruvate, ethyl pyruvate, methyl 3-methoxypropionate, N-methyl-2-pyrrolidone, 2-heptanone, cyclohexanone, diethylene glycol monoethyl ether, diethylene glycol dimethyl ether, etc.

The amount of the solvent used in the present invention is preferably 2 to 20 times, more preferably 3 to 10 times, as much as the total weight of any of polymer components (i) to (iii).

Usualty, the resist composition of the present invention is composed mainly of four components, i.e., any of the above-mentioned polymer components (i) to (iii), the acid generator, the present invention's compound and the solvent. If necessary, the resist composition may contain sensitivity adjustors, surfactants, ultraviolet absorbers, plasticizers, dissolving auxiliaries, etc. in addition to the four components.

As the sensitivity adjustors used if necessary in the resist composition of the present invention, there can be exemplified by poly(vinylpyridine), poly-(vinylpyridine/methyl methacrylate), pyridine, N,N-bis(2-hydroxyethyl)aniline, monoalkylamine, the alkyl group including linear, branched or cyclic alkyl groups of 1 to 12 carbon atoms, specific examples thereof being 2-methylcyclohexylamine, 4-t-butylcyclohexylamine, etc., dialkylamine, the alkyl group including linear, branched or cyclic alkyl groups of 1 to 12 carbon atoms, specific preferable examples thereof being dicyclohexylamine, di-n-octylamine, etc., trialkylamines, the alkyl group including linear, branched or cyclic alkyl groups of 1 to 12 carbon atoms, specific preferable examples thereof being triethylamine, tri-n-propylamine, tri-n-butylamine, trihexylamine, trioctylamine, dicyclohexylmethylamine, dioctylmethylamine, dimethyloctylamine, etc., mono-, di- or trialkanolamines, specific preferable examples thereof being triethanolamine, triisopropanolamine, etc., tetraalkylammonium hydroxides, the alkyl group including linear, branched or cyclic alkyl groups of 1 to 12 carbon atoms, specific preferable examples thereof being tetramethylammonium hydroxide, tetra-n-butylammonium hydroxide, etc., and the like. The sensitivity adjustors are not limited to these compounds.

An amount of the sensitivity adjustors used if necessary is preferably 0.001 to 10 parts by weight, more preferably 0.01 to 5 parts by weight, per 100 parts by weight of any of polymer components (i) to (iii).

As the surfactants used if necessary in the resist composition of the present invention, there can be exemplified by nonionic surfactants, e.g. polyethylene glycol distearate, polyethylene glycol dilaurate, poly(ethylene glycol), poly (propylene glycol), polyoxyethylene stearyl ether, polyoxyethylene cetyl ether, etc., cationic surfactants and anionic surfactants.

Of these surfactants, specific examples of surfactant preferably used from the viewpoint of the formation of a resist film are fluorine-containing nonionic surfactants such as Fluorad (a trade name, SUMITOMO 3M Ltd.), SURFLON (a trade name, Asahi Glass Co., Ltd.), UNIDYNE (a trade name, DAIKIN INDUSTIRIES, LTD.), MEGAFAC (a trade name, DAINIPPON INK AND CHEMICALS, INC.), EFTON (a trade name, TOHKEMPRODUCTS Corporation).

An amount of the surfactants used if necessary is preferably 0.001 to 10 parts by weight, more preferably 0.01 to 5 parts by weight, per 100 parts by weight of any of polymer components (i) to (iii).

As the ultraviolet absorbers used if necessary in the resist composition of the present invention, there can be exemplified by 9-diazofluorene, 9-(2-methoxyethoxymethyl) anthracene, 9-(2-ethoxyethoxymethyl) anthracene, 9-fluorenone, 2-hydroxycarbazole, o-naphthoquinone azide, 4-diazo-1,7-diphenylpentane-3,5-dione, etc.

An amount of the ultraviolet absorbers used if necessary is preferably 0.001 to 10 parts by weight, more preferably 0.01 to 5 parts by weight, per 100 parts by weight of any of polymer components (i) to (iii).

As the plasticizers used if necessary in the resist composition of the present invention, there can be exemplified by di-n-butyl phthalate, bis(2-ethylhexyl)phthalate, dibutyl adipate, diethylene glycol dibenzoate, butyl oleate, methyl acetylricinoleate, chlorinated paraffin, alkyl epoxystearates, etc.

An amount of the plasticizers used if necessary is preferably 0.001 to 10 parts by weight, more preferably 0.01 to 5 parts by weight, per 100 parts by weight of any of polymer components (i) to (iii).

As the dissolving auxiliaries used if necessary in the resist composition of the present invention, there can be exemplified by N,N-dimethylformamide, N,N-dimethylacetamide, etc.

An amount of the dissolving auxiliaries used if necessary is preferably 0.01 to 20 parts by weight, more preferably 0.1 to 10 parts by weight, per 100 parts by weight of any of polymer components (i) to (iii).

A pattern is formed by use of the resist composition of the present invention, for example, as follows.

The resist composition of the present invention is spin-coated on a semiconductor substrate of $SiO_2$, polycrystalline silicon, BPSG, TEOS, TiN, SiN or the like, and baked on a hot plate at 50° C. to 120° C. for 0.5 to 2 minutes to obtain a resist film of 0.5 to 2 µm thick. Subsequently, the resist film is selectively exposed to radiation (e.g. KrF excimer laser beams of 248.4 nm, deep ultraviolet light of 300 nm or less, electron beams, soft X-rays, etc.) through a mask, and then, if necessary, post-baked on a hot plate at 50° C. to 130° C. for 0.5 to 2 minutes. Thereafter, the resist film is developed with an alkali developing solution by a puddle method, a dip method, a spray method or the like to dissolve away the exposed portion, whereby a positive pattern is formed.

The alkali of the alkali developing solution used in any of the above various development methods includes, for example, tetramethylammonium hydroxide, choline, triethanolamine, KOH, NaOH, etc. A concentration thereof is preferably 0.1 to 10% by weight, more preferably 0.5 to 5% by weight. Surfactants and the like may be incorporated into the alkali developing solution.

When the chemical amplified type resist material containing the present invention's compound is used on a special substrate on which an unsatisfactory profile of pattern tends to be obtained because of the presence of a large amount of basic compounds and the like in the substrate, the action of the basic compounds is inhibited, so that a stable and good profile of pattern can be obtained. There are known methods using an organic carboxylic acid or sulfonic acid compound for inhibiting the action of the basic compounds.

These methods, however, involve the following problem: for maintaining the storage stability of a resist composition, a basic compound should be used in an amount larger than that required for neutralizing the acid, so that the resist is decreased in sensitivity and hence deteriorated in practical utility.

The above problem can also be sufficiently solved using the present invention's compound.

The present invention is explained below in detail with reference to Examples and Comparative Examples, which are not by way of limitation but by way of illustration.

Some of the polymers and acid generators, which were used in the Examples and Comparative Examples, had been synthesized, for example, by the processes disclosed in JP-A 4-210960 (U.S. Pat. No. 5,216,135); JP-A 4-211258 (U.S. Pat. No. 5,350,660; European Patent Laid-Open No. 0,440, 374); JP-A 5-249682 (European Patent Laid-Open No. 0,520,642); JP-A 4-251259; Y. Endo et al., Chem. Pharm. Bull., 29 (12), p. 3753 (1981); M. Desbois et al., Bull. Chem. Soc. France, 1974, p. 1956; C. D. Beard et al., J. Org. Chem., 38, p. 3673 (1973); etc.

The weight average molecular weight and the ratio of weight-average molecular weight(Mw) to number-average molecular weight (Mn) (Mw/Mn: dispersity) of each of the polymers used in Examples and Comparative Examples were determined by a gel permeation chromatography (GPC) method using a polystyrene as a standard.

EXAMPLE 1

A resist composition was prepared according to the following recipe:

| | |
|---|---|
| Poly[p-(1-ethoxyethoxy)styrene/p-hydroxystyrene] (Mw:20,000, dispersity:1.90) | 4.5 g |
| Bis(cyclohexylsulfonyl)diazomethane | 0.3 g |
| Bis(p-toluenesulfonyl)diazomethane | 0.15 g |
| Fluorine-containing nonionic surfactant (commercial product) | 0.05 g |
| Tri-n-propylamine | 0.05 g |
| Propylene glycol monomethyl ether acetate | 23 g |
| Phthalimide | 0.02 g |

The above ingredients were mixed to effect dissolution and the resulting solution was filtered through a filter with a pore size of 0.2 µm. Using the thus obtained resist composition, a pattern was formed in the manner described below.

The resist composition according to the above recipe was spin-coated on a semiconductor substrate (a BPSG substrate) obtained by forming a silicon oxide film doped with boron and phosphorus on a silicon wafer, and baked on a hot plate at 90° C. for 90 seconds to obtain a resist film of 1 µm thick. Subsequently, the resist film was selectively exposed to KrF excimer laser beams (NA:0.55) of 248.4 nm through a mask, and then post-baked on a hot plate at 105° C. for 90 seconds. Thereafter, the resist film was developed with an alkali developing solution (a 2.38% aqueous tetramethylammonium hydroxide solution) for 60 seconds by a puddle method to dissolve away only the exposed portion of the resist film, whereby a positive pattern was obtained. As shown in FIG. 1, the obtained positive pattern showed a resolution of a contact hole of 0.25 µm having a good profile. In this case, the exposure dose was 38 mJ/cm$^2$.

When the resist composition according to the above recipe was stored at 23° C. for 3 months and then used for forming a pattern in the same manner as above, a contact hole of 0.25 µm having a good profile was formed at an exposure dose of 38 mJ/cm$^2$. Thus, the storage stability of the resist composition was confirmed.

EXAMPLES 2 TO 29

Resist compositions were prepared according to the respective recipes shown in Tables 1 to 12.

TABLE 1

| | | |
|---|---|---|
| Example 2 | Poly(p-tert-butoxystyrene/p-hydroxystyrene) (Mw:15,000, dispersity:1.95) | 4.5 g |
| | Bis(1,1-dimethylethylsulfonyl)diazomethane | 0.25 g |
| | p-Toluenesulfonylcyclohexylsulfonyl-diazomethane | 0.05 g |
| | Fluorine-containing nonionic surfactant (commercial product) | 0.05 g |
| | Trioctylamine | 0.05 g |
| | Propylene glycol monomethyl ether acetate | 23 g |
| | Succinimide | 0.01 g |
| Example 3 | Poly(p-1-tetrahydropyranyloxystyrene/p-hydroxystyrene) (Mw:20,000, dispersity:1.85) | 4.5 g |
| | Bis(cyclohexylsulfonyl)diazomethane | 0.3 g |
| | Fluorine-containing nonionic surfactant (commercial product) | 0.05 g |
| | Trioctylamine | 0.05 g |
| | Propylene glycol monomethyl ether acetate | 23 g |
| | Glutarimide | 0.01 g |
| Example 4 | Poly[p-(1-methyl-1-methoxyethoxy)styrene/p-hydroxystyrene] (Mw:10,000, dispersity:1.90) | 4.5 g |
| | Bis(1,1-dimethylethylsulfonyl)diazomethane | 0.25 g |
| | Bis(p-toluenesulfonyl)diazomethane | 0.05 g |
| | Fluorine-containing nonionic surfactant (commercial product) | 0.03 g |
| | Trioctylamine | 0.05 g |
| | Propylene glycol monomethyl ether acetate | 23 g |
| | Succinimide | 0.02 g |

TABLE 2

| | | |
|---|---|---|
| Example 5 | Poly(p-tert-butyloxycarbonyloxystyrene/p-hydroxystyrene) (Mw:8,000, dispersity:1.10) | 4.5 g |
| | Bis(cyclohexylsulfonyl)diazomethane | 0.3 g |
| | Bis(p-toluenesulfonyl)diazomethane | 0.05 g |
| | Fluorine-containing nonionic surfactant (commercial product) | 0.03 g |
| | Trioctylamine | 0.05 g |
| | Propylene glycol monomethyl ether acetate | 23 g |
| | Phthalimide | 0.03 g |
| Example 6 | Poly(tert-butyl p-vinylphenoxyacetate/p-hydroxystyrene) (Mw:15,000, dipersity:1.05) | 4.5 g |
| | Bis(cyclohexylsulfonyl)diazomethane | 0.3 g |
| | Bis(2,4-dimethylbenzenesulfonyl)diazomethane | 0.1 g |
| | Fluorine-containing nonionic surfactant (commercial product) | 0.03 g |
| | Trioctylamine | 0.05 g |
| | Propylene glycol monomethyl ether acetate | 23 g |
| | Maleimide | 0.01 g |
| Example 7 | Poly[p-(1-methyl-1-methoxyethoxy)styrene/p-hydroxystyrene] (Mw:20,000, dispersity:1.05) | 4.5 g |
| | Bis(cyclohexylsulfonyl)diazomethane | 0.3 g |
| | Bis(p-toluenesulfonyl)diazomethane | 0.05 g |
| | Fluorine-containing nonionic surfactant (commercial product) | 0.03 g |
| | Tetrabutylammonium hydroxide | 0.05 g |
| | Propylene glycol monomethyl ether acetate | 23 g |
| | Phthalimide | 0.02 g |

TABLE 3

| | | |
|---|---|---|
| Example 8 | Poly[p-(1-ethoxyethoxy)syrene/p-hydroxystyrene] (Mw: 20,000, dispersity: 1.05) | 4.5 g |
| | Bis(cyclohexylsulfonyl)diazomethane | 0.3 g |
| | Fluorine-containing nonionic surfactant (commercial product) | 0.03 g |
| | Dicyclohexylmethylamine | 0.05 g |
| | Propylene glycol monomethyl ether acetate | 23 g |
| | Succinimide | 0.01 g |
| Example 9 | Poly[p-(1-ethoxyethoxy)syrene/p-hydroxystyrene] (Mw: 15,000, dispersity: 1.10) | 4.5 g |
| | Bis(cyclohexylsulfonyl)diazomethane | 0.3 g |
| | Fluorine-containing nonionic surfactant (commercial product) | 0.03 g |
| | 9-Diazofluorene | 0.018 g |

TABLE 3-continued

| | | |
|---|---|---|
| | Dioctylmethylamine | 0.05 g |
| | 2-Heptanone | 23 g |
| | Succinimide | 0.01 g |
| Example 10 | Poly[p-(1-ethoxyethoxy)syrene/p-hydroxystyrene] (Mw: 8,000, dispersity: 1.05) | 4.5 g |
| | Bis(cyclohexylsulfonyl)diazomethane | 0.3 g |
| | Fluorine-containing nonionic surfactant (commercial product) | 0.03 g |
| | Tetrabutylammonium hydroxide | 0.05 g |
| | 9-(2-Methoxyethoxymethyl)anthracene | 0.01 g |
| | Propylene glycol monomethyl ether acetate | 23 g |
| | Phthalimide | 0.02 g |

TABLE 4

| | | |
|---|---|---|
| Example 11 | Poly[p-(1-ethoxyethoxy)styrene/p-tert-butyloxycarbonyloxystyrene/p-hydroxystyrene] (Mw:8,000, dispersity:1.85) | 4.5 g |
| | Bis(p-toluenesulfonyl)diazomethane | 0.3 g |
| | n-Hexanesulfonyloxysuccinimide | 0.1 g |
| | Fluorine-containing nonionic surfactant (commercial product) | 0.03 g |
| | Tetrabutylammonium hydroxide | 0.05 g |
| | 2-Heptanone | 23 g |
| | succinimde | 0.01 g |
| Example 12 | Poly[p-(1-ethoxyethoxy)styrene/p-tert-butoxystyrene/p-hydroxystyrene] (Mw:20,000, dispersity:1.80) | 4.5 g |
| | Bis(cyclohexylsulfonyl)diazomethane | 0.25 g |
| | Triphenylsulfoniumtrifoluoromethane sulfonate | 0.03 g |
| | Fluorine-containing nonionic surfactant (commercial product) | 0.05 g |
| | Tetrabutylammonium hydroxide | 0.05 g |
| | Propylene glycol monomethyl ether acetate | 23 g |
| | Succinimide | 0.01 g |

TABLE 5

| | | |
|---|---|---|
| Example 13 | Poly[p-(1-ethoxyethoxy)styrene/p-tert-butoxystyrene/p-hydroxystyrene] (Mw:15,000, dispersity:1.85) | 4.5 g |
| | Bis(cyclohexylsulfonyl)diazomethane | 0.3 g |
| | Fluorine-containing nonionic surfactant (commercial product) | 0.03 g |
| | Tetrabutylammonium hydroxide | 0.03 g |
| | 2-Heptanone | 23 g |
| | Succinimide | 0.01 g |
| Example 14 | Poly[p-(1-methoxyethoxy)styrene/p-tert-butoxystyrene/p-hydroxystyrene] (Mw:20,000, dispersity:1.90) | 4.5 g |
| | Bis(1,1-dimethylethylsulfonyl)diazomethane | 0.25 g |
| | Bis(p-toluenesulfonyl)diazomethane | 0.05 g |
| | Fluorine-containing nonionic surfactant (commercial product) | 0.03 g |
| | Trioctylamine | 0.05 g |
| | Propylene glycol monomethyl ether acetate | 23 g |
| | Phthalimide | 0.02 g |

TABLE 6

| | | |
|---|---|---|
| Example 15 | Poly[p-(1-ethoxyethoxy)styrene/p-1-tetrahydropyranyloxystyrene/p-hydroxystyrene] (Mw:20,000, dispersity:1.85) | 4.5 g |
| | Bis(cyclohexylsulfonyl)diazomethane | 0.25 g |
| | Bis(benzenesulfonyl)diazomethane | 0.05 g |
| | Fluorine-containing nonionic surfactant (commercial product) | 0.03 g |
| | Trioctylamine | 0.05 g |
| | Propylene glycol monomethyl eteracetate | 23 g |
| | Succinimide | 0.01 g |
| Example 16 | Poly[p-(1-ethoxyethoxy)styrene/p-tert-butoxystyrene/p-hydroxystyrene] (Mw:20,000, | 4.5 g |

TABLE 6-continued

| | | |
|---|---|---|
| dispersity:1.95) | | |
| Bis(cyclohexylsulfonyl)diazomethane | 0.25 | g |
| Bis(p-toluenesulfonyl)diazomethane | 0.05 | g |
| Fluorine-containing nonionic surfactant (commercial product) | 0.05 | g |
| Dioctylmethylamine | 0.05 | g |
| Diethylene glycol dimethyl ether | 23 | g |
| Succinimide | 0.01 | g |

TABLE 7

| | | | |
|---|---|---|---|
| Example 17 | Poly[p-(1-tetrahydropyranyloxy)styrene/p-tert-butoxystyrene/p-hydroxystyrene] (Mw:15,000, dispersity:1.05) | 4.5 | g |
| | Triphenylsulfoniumtrifluoromethane sulfonate | 0.1 | g |
| | Bis(benzenesulfonyl))diazomethane | 0.1 | g |
| | Fluorine-containing nonionic surfactant (commercial product) | 0.03 | g |
| | Trioctylamine | 0.05 | g |
| | 2-Heptanone | 23 | g |
| | Pthalimde | 0.01 | g |
| Example 18 | Poly[p-1-ethoxyethoxy)styrene/p-hydroxystyrene] (Mw:15,000, dispersity:1.10) | 4.5 | g |
| | Poly(p-tert-butyloxycarbonyloxystyrene/p-hydroxystyrene) (Mw:15,000, dispersity:1.05) | 1.5 | g |
| | Bis(cyclohexylsulfonyl)diazomethane | 0.25 | g |
| | Bis(2,4-dimethylbenzenesulfonyl)diazomethane | 0.05 | g |
| | Fluorine-containing nonionic surfactant (commercial product) | 0.03 | g |
| | Trioctylamine | 0.05 | g |
| | Propyrene glycol monomethyl ether acetate | 30 | g |
| | Maleimide | 0.01 | g |

TABLE 8

| | | | |
|---|---|---|---|
| Example 19 | Poly[p-(1-ethoxyethoxy)styrene/p-hydroxystyrene] (Mw:20,000, dispersity::1.80) | 4.5 | g |
| | Poly(p-tert-butoxystyrene/p-hydroxystyrene] (Mw:8,000, dispersity:1.95) | 1.5 | g |
| | Bis(cyclohexylsulfonyl)diazomethane | 0.3 | g |
| | Octanesulfonyloxysuccinimide | 0.3 | g |
| | Fluorine-containing nonionic surfactant (commercial product) | 0.03 | g |
| | Trioctylamine | 0.05 | g |
| | 2-Heptanone | 30 | g |
| | Phthalimde | 0.01 | g |
| Example 20 | Poly[p-(1-ethoxyethoxy)styrene/p-hydroxystyrene] (Mw:20,000, dispersity:1.85) | 4.5 | g |
| | Poly(p-tert-butyloxycarbonyloxystyrene/p-hydroxystyrene) (Mw:8,000, dispersity:1.85) | 1.5 | g |
| | Bis(cyclohexylsulfonyl)diazomethane | 0.25 | g |
| | Bis(2,4-dimethylbenzenesulfonyl)diazomehane | 0.05 | g |
| | Fluorine-containing nonionic surfactant (commercial product) | 0.03 | g |
| | Trioctylamine | 0.05 | g |
| | Diethylene glycol dimethyl ether | 30 | g |
| | Maleimide | 0.01 | g |

TABLE 9

| | | | |
|---|---|---|---|
| Example 21 | Poly[p-(1-ethoxyethoxy)styrene/p-hydroxystyrene] (Mw:20,000, dispersity:1.05) | 4.5 | g |
| | Bis(cyclohexylsulfonyl)diazomethane | 0.3 | g |
| | Fluorine-containing nonionic surfactant (commercial product) | 0.05 | g |
| | Tetrabutylammonium hydroxide | 0.05 | g |
| | Cyclohexanone | 23 | g |
| | Succinimide | 0.01 | g |
| Example 22 | Poly(p-hydroxystyrene) (Mw:8,000, dispersity:1.85) | 4.5 | g |
| | 2,2-Bis[4-(1-ethoxyethoxy)phenyl]propane | 1.5 | g |
| | Bis(cyclohexylsulfonyl)diazomethane | 0.3 | g |

TABLE 9-continued

| | | | |
|---|---|---|---|
| | Nonionic surfactant (commercial product) | 0.03 | g |
| | Dicyclohexylmethylamine | 0.05 | g |
| | Propylene glycol monomethyl ether acetate | 30 | g |
| | Succinimide | 0.01 | g |
| Example 23 | Poly[p-(1-ethoxyethoxy)styrene/p-hydroxystyrene] (Mw:20,000, dispersity:1.90) | 4.5 | g |
| | Bis(cyclohexylsulfonyl)diazomethane | 0.3 | g |
| | Bis(p-toluenesulfonyl)diazomethane | 0.15 | g |
| | Fluorine-containing nonionic surfactant (commercial product) | 0.05 | g |
| | Tri-n-propylamine | 0.05 | g |
| | Propylene glycol monomethyl ether acetate | 23 | g |
| | Diacetamide | 0.02 | g |

TABLE 10

| | | | |
|---|---|---|---|
| Example 24 | Poly[p-(1-ethoxyethoxy)styrene/p-hydroxystyrene] (Mw:15,000, dispersity:1.95) | 4.5 | g |
| | Bis(cyclohexylsulfonyl)diazomethane | 0.3 | g |
| | Fluorine-containing nonionic surfactant (commercial product) | 0.03 | g |
| | Tetrabutylammonium hydroxide | 0.05 | g |
| | Propylene glycol monomethyl ether acetate | 23 | g |
| | Diacetylurea | 0.02 | g |
| Example 25 | Poly[p-(1-methyl-1-methoxyethoxy)styrene/p-hydroxystyrene] (Mw:20,000, dispersity:1.05) | 4.5 | g |
| | Bis(cyclohexylsulfonyl)diazomethane | 0.3 | g |
| | Bis(p-toluenesulfonyl)diazomethane | 0.05 | g |
| | Fluorine-containing nonionic surfactant (commercial product) | 0.03 | g |
| | Tetrabutylammonium hydroxide | 0.05 | g |
| | Propylene glycol monomethyl ether acetate | 23 | g |
| | Dibenzoylurea | 0.02 | g |
| Example 26 | Poly[p-(1-ethoxyethoxy)styrene/p-hydroxystyrene] (Mw:20,000, dispersity:1.05) | 4.5 | g |
| | Bis(cyclohexylsulfonyl)diazomethane | 0.3 | g |
| | Fluorine-containing nonionic surfactant (commercial product) | 0.03 | g |
| | Dicyclohexylmethylamine | 0.05 | g |
| | Propylene glycol monomethyl ether acetate | 23 | g |
| | Methanesulfonamide | 0.01 | g |

TABLE 11

| | | | |
|---|---|---|---|
| Example 27 | Poly[p-tetrahydropyranyloxystyrene/p-hydroxystyrene] (Mw:15,000, dispersity:1.10) | 4.5 | g |
| | Bis(cyclohexylsulfonyl)diazomethane | 0.3 | g |
| | Fluorine-containing nonionic surfactant (commercial product) | 0.03 | g |
| | Dioctylmethylamine | 0.05 | g |
| | 9-Diazofluorene | 0.01 | g |
| | 2-Heptanone | 23 | g |
| | p-Touenesulfonamide | 0.01 | g |
| Example 28 | Poly[p-ethoxyethoxy)styrene/tert-butoxystyrene/p-hydroxytyrene] (Mw:15,000, dispersity:1.85) | 4.5 | g |
| | Bis(cyclohexylsulfonyl)diazomethane | 0.3 | g |
| | Fluorine-containing nonionic surfacant (commercial product) | 0.03 | g |
| | Tetrabutylammonium hydroxide | 0.03 | g |
| | 2-Heptanone | 23 | g |
| | benzenesulfonamide | 0.01 | g |

TABLE 12

| | | | |
|---|---|---|---|
| Example 29 | Poly[p-(1-ethoxyethoxy)styrene/p-hydroxystyrene] (Mw:20,000, dispersity:1.05) | 4.5 | g |
| | Poly(p-tert-butoxycarbonyloxystyrene/p-hydroxystyrene) (Mw:8,000, dispersity:1.85) | 1.5 | g |
| | Bis(cyclohexylsulfonyl)diazomethane | 0.25 | g |
| | Bis(2,4-dimethylbenzenesulfonyl)diazomethane | 0.05 | g |

TABLE 12-continued

| | |
|---|---|
| Fluorine-containing nonionic surfactant (commercial product) | 0.03 g |
| Trioctylamine | 0.05 g |
| Diethylene glycol | 30 g |
| N-Benzoylbenzamide | 0.01 g |

Pattern formation was carried out in the same manner as in Example 1 except for using each of the resist compositions prepared according to the respective recipes shown in Tables 1 to 12. The results obtained are shown in Tables 13 and 14.

TABLE 13

| Example No. | Exposure dose (mJ/cm$^2$) | Resolution ($\mu$mC/H) | Profile of pattern | Storage stability |
|---|---|---|---|---|
| 2 | 54 | 0.35 | Good | Good |
| 3 | 46 | 0.35 | Good | Good |
| 4 | 33 | 0.25 | Good | Good |
| 5 | 52 | 0.45 | Good | Good |
| 6 | 50 | 0.40 | Good | Good |
| 7 | 35 | 0.25 | Good | Good |
| 8 | 38 | 0.25 | Good | Good |
| 9 | 38 | 0.25 | Good | Good |
| 10 | 36 | 0.25 | Good | Good |
| 11 | 40 | 0.30 | Good | Good |
| 12 | 40 | 0.30 | Good | Good |
| 13 | 40 | 0.30 | Good | Good |
| 14 | 40 | 0.30 | Good | Good |
| 15 | 38 | 0.30 | Good | Good |
| 16 | 36 | 0.25 | Good | Good |
| 17 | 38 | 0.35 | Good | Good |
| 18 | 38 | 0.30 | Good | Good |
| 19 | 38 | 0.25 | Good | Good |
| 20 | 38 | 0.25 | Good | Good |
| 21 | 38 | 0.25 | Good | Good |
| 22 | 44 | 0.35 | Good | Good |

TABLE 14

| Example No. | Exposure dose (mJ/cm$^2$) | Resolution ($\mu$mC/H) | Profile of pattern | Storage stability |
|---|---|---|---|---|
| 23 | 38 | 0.25 | Good | Good |
| 24 | 38 | 0.25 | Good | Good |
| 25 | 35 | 0.25 | Good | Good |
| 26 | 38 | 0.25 | Good | Good |
| 27 | 38 | 0.25 | Good | Good |
| 28 | 40 | 0.30 | Good | Good |
| 29 | 35 | 0.30 | Good | Good |

Comparative Example 1

A resist composition was prepared according to the following recipe which was the same as the recipe for the resist composition of Example 1 except that the present invention's compound was omitted. Except for using the thus prepared resist composition, a pattern was formed in the same manner as described in Example 1:

| | |
|---|---|
| Poly[p-(1-ethoxyethoxy)styrene/p-hydroxystyrene] (Mwl.:20,000, dispersity:1.90) | 4.5 g |
| Bis(cyclohexylsulfonyl)diazomethane | 0.3 g |
| Bis(p-toluenesulfonyl)diazomethane | 0.15 g |
| Fluorine-containing nonionic surfactant (commercial product) | 0.05 g |
| Tri-n-propylamine | 0.05 g |
| Propylene glycol monomethyl ether acetate | 23 g |

Figure 2:
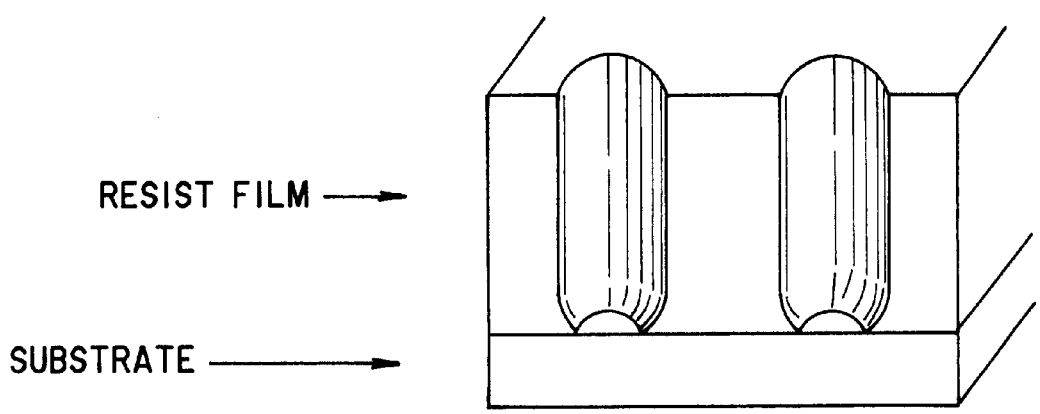
FIG. 2 is a cross-sectional view of a contact hole with an unsatisfactory profile obtained by using a resist composition containing no compound of the present invention compound.

As a result, a contact hole of 0.25 $\mu$m could be resolved at an exposure dose of 38 mJ/cm$^2$, but the pattern had an unsatisfactory profile with footing at the bottom of a resist film as shown in FIG. 2.

Comparative Example 2

A resist composition was prepared according to the following recipe using a known technology, and a pattern was formed in the same manner as described in Example 1 except for using said resist composition:

| | |
|---|---|
| Poly[p-(1-ethoxyethoxy)styrene/p-hydroxystyrene] (Mw:20,000, dispersity:1.90) | 4.5 g |
| Bis(cyclohexylsulfonyl)diazomethane | 0.3 g |
| Bis(p-toluenesulfonyl)diazomethane | 0.15 g |
| Fluorine-containing nonionic surfactant (commercial product) | 0.05 g |
| Tri-n-propylamine | 0.05 g |
| Propylene glycol monomethyl ether acetate | 23 g |
| Salicylic acid | 0.02 g |

Figure 3:
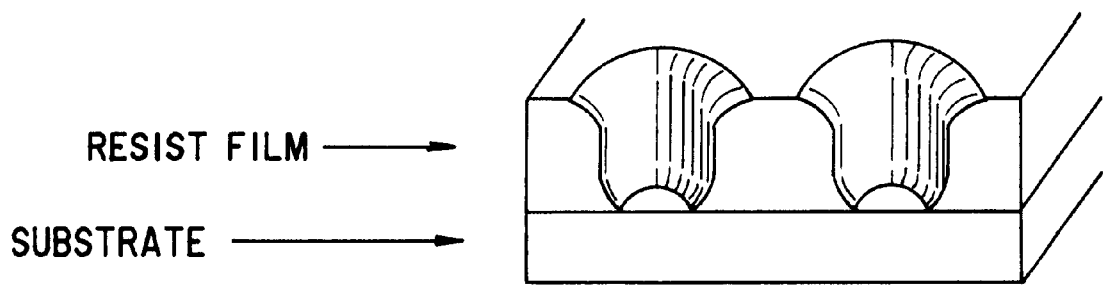
FIG. 3 is a cross-sectional view of a contact hole with an unsatisfactory profile obtained by using a resist composition of prior art after storage at 23° C. for 2 weeks.

As a result, a contact hole of 0.25 $\mu$m having a good profile could be resolved at an exposure dose of 38 mJ/cm$^2$. However, when the resist composition was stored at 23° C. for 2 weeks and then used for forming a pattern in the same manner as described in Example 1, also the non-exposed portion was dissolved during development, so that no desired pattern could be obtained as shown in FIG. 3. Thus, the storage stability was not good.

Comparative Example 3

A resist composition was prepared according to the same recipe as in Comparative Example 2 except for increasing the amount of tri-n-propylamine to 0.1 g. A pattern was formed in the same manner as described in Example 3 except for using said resist composition.

When the resist composition was used on the pattern formation just after preparation or after storage at 23° C. for 1 month, the resist composition gave a contact hole of 0.25 $\mu$m having a good profile but had such a low sensitivity that the exposure dose was 110 mJ/cm$^2$.

Comparative Example 4

A resist composition was prepared according to the same recipe as in Comparative Example 3 except for using phthalic acid in place of salicylic acid. A pattern was formed in the same manner as described in Example 3 except for using said resist composition.

Even when used after storage at 23° C. for 1 month, the resist composition gave a contact hole of 0.25 g m but had such a low sensitivity that the exposuredose was 110 mJ/cm$^2$, like the resist composition of Comparative Example 3.

EXAMPLE 30

A resist composition was prepared according to the following recipe:

| | |
|---|---|
| Poly[p-(1-ethoxyethoxy)styrene/p-hydroxystyrene] (Mw:20,000, dispersity:1.90) | 4.5 g |
| Bis(cyclohexylsulfonyl)diazomethane | 0.3 g |
| Bis(p-toluenesulfonyl)diazomethane | 0.15 g |
| Fluorine-containing nonionic surfactant (commercial product) | 0.05 g |
| Tri-n-propylamine | 0.05 g |
| Propylene glycol monomethyl ether acetate | 23 g |
| Phthalimide | 0.02 g |

The above ingredients were mixed to effect dissolution and the resulting solution was filtered through a filter with a pore size of 0.2 μm. Using the thus obtained resist composition, a pattern was formed in the manner described below.

Figure 4:
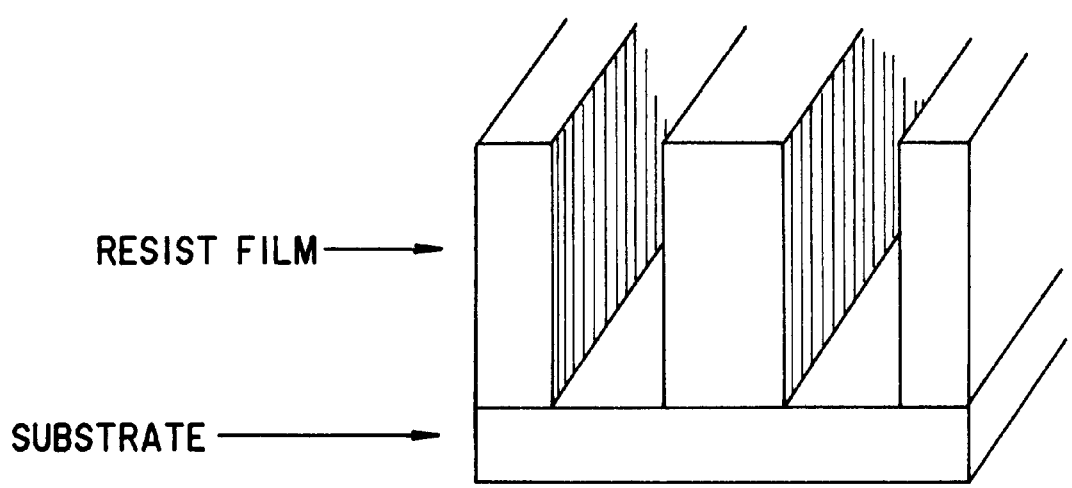
FIG. 4 is a cross-sectional view of a line-and-space pattern with a good profile obtained by using a resist composition containing the compound of the present invention compound.

The resist composition according to the above recipe was spin-coated on a titanium nitride substrate (a TiN substrate) and baked on a hot plate at 90° C. for 90 seconds to obtain a resist film of 1 μm thick. Subsequently, the resist film was selectively exposed to KrF excimer laser beams (NA:0.55) of 248.4 nm through a mask, and then post-baked on a hot plate at 105° C. for 90 seconds. Thereafter, the resist film was developed with an alkali developing solution (a 2.38% aqueous tetramethylammonium hydroxide solution) for 60 seconds by a puddle method to dissolve away only the exposed portion of the resist film, whereby a positive pattern was obtained. As shown in FIG. 4, the obtained positive pattern showed a resolution of 0.20 μm line-and-space having a good profile. In this case, the exposure dose was 30 mJ/cm$^2$.

When the resist composition according to the above recipe was stored at 23° C. for 3 months and then used for forming a pattern in the same manner as above, 0.20 μm line-and-space having a good profile could be formed at an exposure dose of 30 mJ/cm$^2$. Thus, the storage stability of the resist composition was confirmed.

EXAMPLES 31 TO 43

Resist compositions were prepared according to the respective recipes shown in Tables 15 to 20.

TABLE 15

| | | |
|---|---|---|
| Example 31 | Poly[p-(1-ethoxyethoxy)styrene/p-hydroxystyrene] (Mw:15,000, dispersity:1.95) | 4.5 g |
| | Bis(cyclohexylsulfonyl)diazomethane | 0.3 g |
| | Fluorine-containing nonionic surfactant (commercial product) | 0.03 g |
| | Tetrabutylammonium hydroxide | 0.05 g |
| | Propylene glycol monomethyl ether acetate | 23 g |
| | Succinimide | 0.02 g |
| Example 32 | Poly[p-(1-methyl-1-methoxyethoxy)styrene/p-hydroxystyrene] (Mw:20,000, dispersity:1.05) | 4.5 g |
| | Bis(cyclohexylsulfonyl)diazomethane | 0.3 g |
| | Bis(p-toluenesulfonyl)diazomethane | 0.05 g |
| | Fluorine-containing nonionic surfactant (commercial product) | 0.03 g |
| | Tetrabutylammonium hydroxide | 0.05 g |
| | Propylene glycol monomethyl ether acetate | 23 g |
| | Phthalimide | 0.02 g |
| Example 33 | Poly[p-(1-ethoxyethoxy)styrene/p-hydroxystyrene] (Mw:20,000, dispersity:1.05) | 4.5 g |
| | Bis(cyclohexylsulfonyl)diazomethane | 0.3 g |
| | Fluorine-containing nonionic surfactant (commercial product) | 0.03 g |
| | Dicyclohexylmethylamine | 0.05 g |
| | Propylene glycol monomethyl ether acetate | 23 g |
| | Succinimide | 0.01 g |

TABLE 16

| | | |
|---|---|---|
| Example 34 | Poly[p-(1-ethoxyethoxy)styrene/p-hydroxystyrene] (Mw:15,000, dispersity:1.95) | 4.5 g |
| | Bis(cyclohexylsulfonyl)diazomethane | 0.3 g |
| | Fluorineine-containing nonionic surfactant (commercial product) | 0.03 g |
| | Dioctylmethylamine | 0.05 g |
| | 9-Diazofluorene | 0.01 g |
| | 2-Heptanone | 23 g |
| | Phthalimide | 0.01 g |
| Example 35 | Poly[p-(1-ethoxyethoxy)styrene/p-tert-butoxystyrene/p-hydroxystyrene] (Mw: 15,000, dispersity:1.85) | 4.5 g |
| | Fluorine-containing nonionic surfactant (commercial product) | 0.03 g |
| | Tetrabutylammonium hydroxide | 0.03 g |
| | 2-Heptanone | 23 g |
| | Succinimide | 0.02 g |

TABLE 17

| | | |
|---|---|---|
| Example 36 | Poly[p-(1-ethoxyethoxy)styrene/p-hydroxystyrene] (Mw:20,000, dispersity:1.85) | 4.5 g |
| | Poly(p-tert-butyloxycarbonyloxystyrene/p-hydroxystyrene) (Mw:8,000, dispersity:1.85) | 1.5 g |
| | Bis(cyclohexylsulfonyl)diazomethane | 0.25 g |
| | Bis(2,4-dimethylbenzenesulfonyl)diazomethane | 0.05 g |
| | Fluorine-containing nonionic surfactant (commercial product) | 0.03 g |
| | Trioctylamine | 0.05 g |
| | Diethylene glycol dimethyl ether | 30 g |
| | Phthalimide | 0.01 g |
| Example 37 | Poly[p-(1-ethoxyethoxy)styrene/p-hydroxystyrene] (Mw:20,000, dispersity:1.90) | 4.5 g |
| | Bis(cyclohexylsulfonyl)diazomethane | 0.3 g |
| | Bis(p-toluenesulfonyl)diazomethane | 0.15 g |
| | Fluorine-containing nonionic surfactant (commercial product) | 0.05 g |
| | Tri-n-propylamine | 0.05 g |
| | Propylene glycol monoethyl ether acetate | 23 g |
| | Diacetamide | 0.02 g |

TABLE 18

| | | |
|---|---|---|
| Example 38 | Poly[p-(1-ethoxyethoxy)styrene/p-hydroxystyrene] (Mw:15,000, dispersity:1.95) | 4.5 g |
| | Bis(cyclohexylsulfonyl)diazomethane | 0.3 g |
| | Fluorine-containing nonionic surfactant (commercial product) | 0.03 g |
| | Tetrabutylammonium hydroxide | 0.05 g |
| | Propylene glycol monomethyl ether acetate | 23 g |
| | Diacetylurea | 0.02 g |
| Example 39 | Poly[p-(1-methyl-1-methoxyethoxy)styrene/p-hydroxystyrene] (Mw:20,000, dispersity:1.05) | 4.5 g |
| | Bis(cyclohexylsulfonyl)diazomethane | 0.3 g |
| | Bis(p-toluenesulfonyl)diazomethane | 0.05 g |
| | Fluorine-containing nonionic surfactant (commercial product) | 0.03 g |
| | Tetrabutylammonium hydroxide | 0.05 g |
| | Propylene glycol monomethyl ether acetate | 23 g |
| | Dibenzoylurea | 0.02 g |
| Example 40 | Poly[p-(1-ethoxyethoxy)styrene/p-hydroxystyrene] (Mw:20,000, dispersity:1.05) | 4.5 g |
| | Bis(cyclohexylsulfonyl)diazomethane | 0.3 g |
| | Fluorine-containing nonionic surfactant | 0.03 g |

TABLE 18-continued

| | |
|---|---|
| (commercial product) | |
| Dicyclohexylmethylamine | 0.05 g |
| Propylene glycol monomethyl ether acetate | 23 g |
| Methanesulfonamide | 0.01 g |

TABLE 19

| | | |
|---|---|---|
| Example 41 | Poly[p-tetrahydropyranyloxystyrene/p-hydroxystyrene] (Mw:15,000, dispersity:1.10) | 4.5 g |
| | Bis(cyclohexylsulfonyl)diazomethane | 0.3 g |
| | Fluorine-containing nonionic surfactant (commercial product) | 0.03 g |
| | Dioctylmethylamine | 0.05 g |
| | 9-Diazofluorene | 0.01 g |
| | 2-Heptanone | 23 g |
| | p-Tolenesulfonamide | 0.01 g |
| Example 42 | Poly[p-(1-ethoxyethoxy)styrene/p-tert-butoxystyrene/p-hydroxystyrene] (Mw: 15,000, dispersity:1.85) | 4.5 g |
| | Bis(cyclohexylsulfonyl)diazomethane | 0.3 g |
| | Fluorine-containing nonionic surfactant (commercial product) | 0.03 g |
| | Tetrabutylammonium hydroxide | 0.03 g |
| | 2-Heptanone | 23 g |
| | Benzenesulfonamide | 0.01 g |

TABLE 20

| | | |
|---|---|---|
| Example 43 | Poly[p-(1-ethoxyethoxy)styrene/p-hydroxystyrene] (Mw:20,000, dispersity:1.05) | 4.5 g |
| | Poly(p-tert-butoxycarbonyloxy)styrene/P-hydroxystyrene (Mw:8,000, dispersity:1.85) | 1.5 g |
| | Bis(cyclohexylsulfonyl)diazomethane | 0.25 g |
| | Bis(2,4-dimethylbenzenesulfonyl)diazomethane | 0.05 g |
| | Fluorine-containing nonionic surfactant (commercial product) | 0.03 g |
| | Trioctylamine | 0.05 g |
| | Diethylene glycol | 30 g |
| | N-Benzoylbenzamide | 0.01 g |

Pattern formation was carried out in the same manner as in Example 30 except for using each of the resist compositions prepared according to the respective recipes shown in Tables 15 to 20. The results obtained are shown in Table 21.

TABLE 21

| Example No. | Exposure dose (mJ/cm$^2$) | Resolution ($\mu$mL/S) | Profile of pattern | Storage stability |
|---|---|---|---|---|
| 31 | 40 | 0.22 | Good | Good |
| 32 | 32 | 0.20 | Good | Good |
| 33 | 36 | 0.20 | Good | Good |
| 34 | 36 | 0.20 | Good | Good |
| 35 | 42 | 0.22 | Good | Good |
| 36 | 38 | 0.22 | Good | Good |
| 37 | 38 | 0.25 | Good | Good |
| 38 | 40 | 0.22 | Good | Good |
| 39 | 32 | 0.20 | Good | Good |
| 40 | 36 | 0.20 | Good | Good |
| 41 | 36 | 0.20 | Good | Good |
| 42 | 38 | 0.22 | Good | Good |
| 43 | 36 | 0.22 | Good | Good |

Comparative Example 5

A resist composition was prepared according to the following recipe which was the same as the recipe for the resist composition of Example 30 except that the present invention's compound was omitted. Except for using the thus prepared resist composition, a pattern was formed in the same manner as described in Example 30:

| | |
|---|---|
| Poly[p-(1-ethoxyethoxy)styrene/p-hydroxystyrene] (Mw:20,000, dispersity:1.90) | 4.5 g |
| Bis(cyclohexylsulfonyl)diazomethane | 0.3 g |
| Bis (p-toluenesulfonyl)diazomethane | 0.15 g |
| Fluorine-containing nonionic surfactant (commercial product) | 0.05 g |
| Tri-n-propylamine | 0.05 g |
| Propylene glycol monomethyl ether acetate | 23 g |

Figure 5:
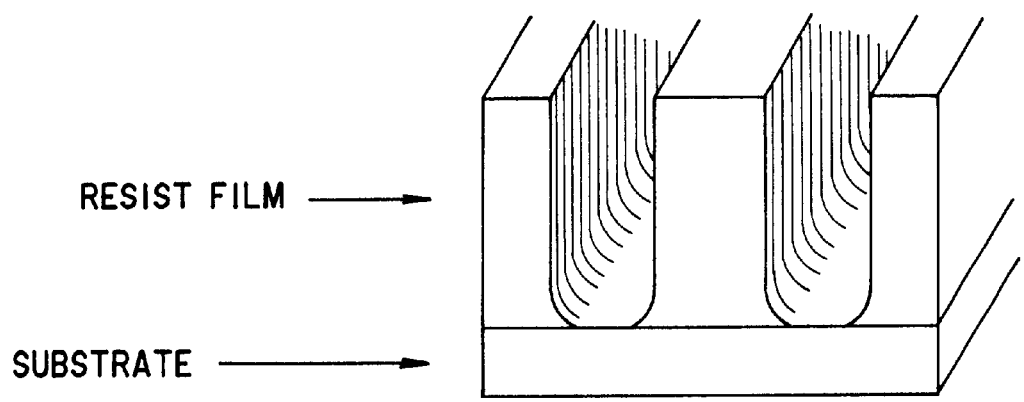
FIG. 5 is a cross-sectional view of a line-and-space pattern with an unsatisfactory profile obtained by using a resist composition containing no compound of the present invention.

As a result, 0.20 $\mu$m line-and-space could be resolved at an exposure dose of 30 mJ/cm$^2$, but the pattern had an unsatisfactory profile with footing at the bottom of a resist film as shown in FIG. 5.

Comparative Example 6

A resist composition was prepared according to the following recipe using a known technology, and a pattern was formed in the same manner as described in Example 30 except for using said resist composition:

| | |
|---|---|
| Poly[p-(1-ethoxyethoxy)styrene/p-hydroxystyrene] (Mw:20,000, dispersity:1.90) | 4.5 g |
| Bis(cyclohexylsulfonyl)diazomethane | 0.3 g |
| Bis(p-toluenesulfonyl)diazomethane | 0.15 g |
| Fluorine-containing nonionic surfactant (commercial product) | 0.05 g |
| Tri-n-propylamine | 0.05 g |
| Propylene glycol monomethyl ether acetate | 23 g |
| Salicylic acid | 0.02 g |

Figure 6:
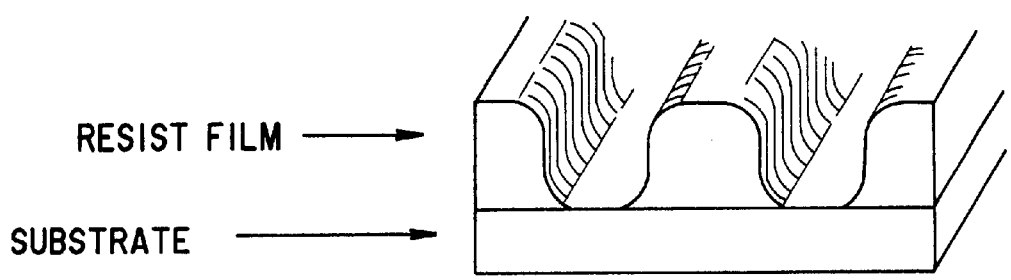
FIG. 6 is a cross-sectional view of a line-and-space pattern with an unsatisfactory profile obtained by using the resist composition of prior art after storage at 23° C. for 2 weeks.

As a result, 0.20 $\mu$m line-and-space having a good profile could be resolved at an exposure dose of 32 mJ/cm2. However, when the resist composition was stored at 23° C. for 2 weeks and then used for forming a pattern in the same manner as described in Example 30, also the non-exposed portion was dissolved during development, so that no desired pattern could be obtained as shown in FIG. 6. Thus, the storage stability was not good.

Comparative Example 7

A resist composition was prepared according to the same recipe as in Comparative Example 6 except for increasing the amount of tri-n-propylamine to 0.1 g. A pattern was formed in the same manner as described in Example 30 except for using said resist composition.

When the resist composition was used on the pattern formation just after preparation or after storage at 23° C. for 1 month, the resist composition gave 0.20 $\mu$m line-and-space having a good profile but had such a low sensitivity that the exposure dose was 72 mJ/cm$^2$.

Comparative Example 8

A resist composition was prepared according to the same recipe as in Comparative Example 6 except for using phthalic acid in place of salicylic acid. A pattern was formed in the same manner as described in Example 30 except for using said resist composition.

Even when used after storage at 23° C. for 1 month, the resist composition gave 0.20 $\mu$m line-and-space having a good profile but had such a low sensitivity that the exposure dose was 72 mJ/cm$^2$, like the resist composition of Comparative Example 7.

As is clear from the above, when the resist composition of the present invention is used on a special substrate such as a TiN substrate or a BPSG substrate as a resist material for exposure to deep ultraviolet light (300 nm or less) or KrF excimer laser beams (248.4 nm), the resist composition can give a good profile of pattern of quarter micron order without causing footing, while retaining high resolution ability and high sensitivity. Therefore, the present invention is of great value in formation of an ultra-fine pattern in the semiconductor industry and the like.

The present invention's compound is effective as a substrate dependence reducing agent particularly in pattern formation using deep ultraviolet light or KrF excimer laser beams. It is sufficiently usable also for pattern formation using electron beams, X-rays, ArF excimer laser beams or the like.

What is claimed is:

1. A resist composition consisting essentially of a polymer capable of becoming alkali-soluble owing to the action of an acid, a compound capable of generating an acid upon irradiation with actinic radiation, a compound containing in the molecule at least one structure in which at least one of the direct links of —NH— is directly bonded to at least one member selected from the group consisting of —C(=O)—, —C(=S)— and —SO$_2$—, and a solvent capable of dissolving these three components.

2. A resist composition consisting essentially of an alkali-soluble polymer, a compound capable of becoming alkali-soluble owing to the action of an acid, a compound capable of generating an acid upon irradiation with actinic radiation, a compound containing in the molecule at least one structure in which at least one of the direct links of —NH— is directly bonded to at least one member selected from the group consisting of —C(=O)—, —C(=S)— and —SO$_2$—, and a solvent capable of dissolving these four components.

3. A resist composition consisting essentially of an alkali-soluble polymer, a compound capable of making the polymer scarcely alkali-soluble by crosslinkng therewith owing to the action of an acid, a compound capable of generating an acid upon irradiation with actinic radiation, a compound containing in the molecule at least one structure in which at least one of the direct links of —NH— is directly bonded to at least one member selected from the group consisting of —C(=O)—, —C(=S)— and —SO$_2$—, and a solvent capable of dissolving these four components.

4. A resist composition according to any one of claims 1 to 3, wherein the compound containing in the molecule at least one structure in which at least one of the direct links of —NH— is directly bonded to at least one member selected from the group consisting of —C(=O)—, —C(=S S)— and —SO$_2$— is a cyclic compound.

5. A resist composition according to any one of claims 1 to 3, wherein the compound containing in tie molecule at least one structure in which at least one of the direct links of —NH— is directly bonded to at least one member selected from the group consisting of —C(=O)—, —C(=S)— and —SO$_2$— is an a compound in h the group —NH— and the group or groups directly bonded to —NH— do not form a ring.

6. A resist composition according to claim 1, wherein the polymer capable of becoming alkali-soluble owing to the action of an acid is one shown by the following formula (5) or (6):

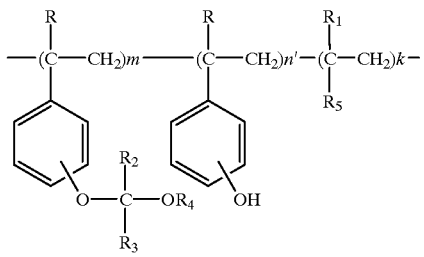

(5)

wherein R and $R_1$ are independently a hydrogen atom or a lower alkyl group; $R_2$ and $R_3$ are independently a hydrogen atom, an alkyl group which is optionally substituted by at least one halogen atom, or an aryl group, except for the case where both $R_2$ and $R_3$ are hydrogen atoms, and $R_2$ and $R_3$ optionally form together an alkylene ring; $R_4$ is an alkyl group optionally substituted by at least one halogen atom, or an aralkyl group; $R_5$ is a cyano group, an esterified or non-esterified carboxyl group or a substituted or unsubstituted phenyl group; each of m and n' is independently an integer; and k is zero or an integer, provided that m>k;

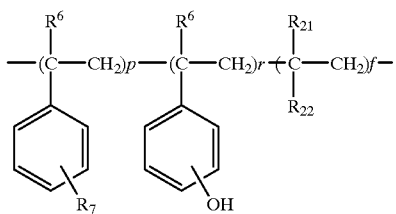

(6)

wherein $R_6$ is a hydrogen atom or a lower alkyl group; $R_7$ is a hydrogen atom, a lower alkyl group, a lower alkoxy group, an acyloxy group, a saturated heterocyclic oxy group, or a group represented by $R_8O$—CO—$(CH_2)_z$—O— wherein $R_8$ is an alkyl group and z is zero or an integer; $R_{21}$ is a hydrogen atom or a lower alkyl group; $R_{22}$ is a cyano group, an esterified or non-esterified carboxyl group, or a substituted or unsubstituted pheny group, provided that in the case of $R_7$ being a hydrogen atom or a lower alkyl group, $R_{22}$ is an alkoxy group, a 5- or 6-membered saturated heterocyclic group or a substituted phenyl group having as a substituent a group represented by $R_{25}O$—CO—$(CH_2)_j$O— wherein $R_{25}$ is a lower alkyl group and j is 0 or 1; each of p and r is independently an integer; and f is zero or an integer, provided that p>f.

7. A resist composition according of claim 2, wherein the alkali-soluble polymer is one selected from the group consisting of poly(p-hydroxystyrene), poly(m-hydorxystyrene), poly(3-methyl-4-hydroxystyrene), poly(p-tert-butoxystyrene/p-hydroxystyrene) wherein the ration of p-tert-butoxystyrene units to p-hydroxystyrene units is limited to 2 or less: 8 or more, said ratio being hereinafter represented by 2↓:8↑, poly(p-1-ethoxyethoxystyrene/p-hydroxystyrene) wherein the ratio of p-1-ethoxyethoxystyrene units to p-hydorxystyrene units is limited to 2↓:8↑, poly(p-tert-butoxycarbonyloxystyrene/p-hydorxystyrene) wherein the ratio of p-tert-butoxycarbonyloxystyrene units to p-hydroxystyrene units is limited to 2↓:8↑, poly(p-1-ethoxyethoxystyrene/p-tert-butoxystyrene/p-hydroxystyrene) wherein the ratio of the sum of p-1-ethoxyethoxystyrene units and p-tertbutoxystyrene units to p-hydroxystyrene units is limited to 2↓:8↑, poly(p-1-ethoxyethoxystyrene/styrene/p-hydroxystyrene) wherein the ratio of the sum of p-1-ehtoxyethoxystyrene units and styrene units to p-hydroxystyrene units is limited to 2↓:8↑.

8. A resist composition according to claim 2, wherein the compound capable of becoming alkali-soluble owing to the action of an acid is an alkali-insoluble compound obtained by protecting at least a part or all of the phenolic hydroxyl groups of an alkali-soluble compound with at least one member selected from the group consisting of a tert-butoxycarbonyl group, a tert-butyl group, a 1-methoxyethyl group, a 1-ethoxyethyl group, a tetrahydropyranyl group, and a 1-methylcyclohexyloxycarbonylmethyl group.

9. A resist composition according to claim 3, wherein the alkali-soluble polymer is one selected from the group consisting of poly(p-hydroxystyrene), poly(m-hydroxystyrene), poly(3-methyl-4-hydroxystyrene), poly(p-tert-butoxystyrene/p-hydroxystyrene) wherein the ratio of p-tert-butoxystyrene units to p-hydrostyrene units is limited to 2 or less: 8 or more, said ratio being hereinafter represented by 2↓:8↑, poly(p-1-ehtoxyethoxystyrene/p-hydroxystyrene) wherein the ratio of p-1-ethoxyethoxystyrene units to p-hydroxystyrene units is limited to 2↓:8↑, poly(p-tert-butoxycarbonyloxystyrene/p-hydroxystyrene) wherein the ratio of p-tert-butoxycarbonyloxystyrene units to p-hydroxystyrene units is limited to 2↓:8↑, poly(p-1-ethoxyethoxystyrene/p-tert-butoxystyrene/p-hydroxystyrene) wherein the ration of the sum of p-1-ehtoxyethoxystyrene units and p-tert-butoxystyrene units to p-hydroxystyrene units is limited to 2↓:8↑, ↑, poly(p-1-ethoxyethoxystyrene/styrene/p-hydroxystyrene) wherein the ratio of the sum of p-1-ethoxyethoxystyrene units and styrene units to p-hydroxystyrene units is limited to 2↓:8↑.

10. A resist composition according to claim 3, wherein the compound capable of making the polymer scarcely alkali-soluble by crosslinking therewith owing to the action of an acid is shown by the formula (7):

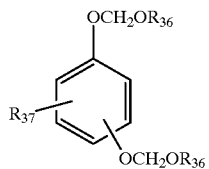

(7)

wherein $R_{36}$ is an alkyl group, and $R_{37}$ is a hydrogen atom or a group represented by the formula (8):

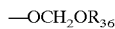

(8)

wherein $R_{36}$ is as defined above, or the compound capable of making the polymer scarcely alkali-soluble by crosslinking therewith owing to the action of an acid is shown by the formula (9)

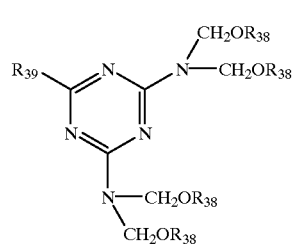

(9)

wherein $R_{38}$ is a hydrogen atom or an alkyl group, and $R_{39}$ is a hydrogen atom or a group represented by the formula (10):

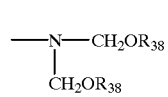

(10)

wherein $R_{38}$ is as defined above.

11. A resist composition according to claim 4, wherein the cyclic compound is a compound represented by the following formula (1), (2) or (3):

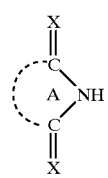

(1)

wherein X is an oxygen atom or a sulfur atom, and A is a saturated or unsaturated 5- or 6-membered ring which optionally contains an oxygen atom, a nitrogen atom or a sulfur atom as a constituent of the ring, and the carbon atoms constituting the ring optionally have substituents:

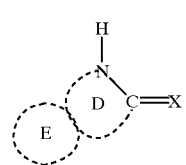

(2)

wherein X is an oxygen atom or a sulfur atom, D is a saturated or unsaturated 5- or 6-membered ring which optionally contains an oxygen atom, a nitrogen atom, or a sulfur atom as a constituent of the ring, the carbon atoms constituting the ring optionally have substituents, the sulfur atom optionally has one or two oxo groups, and E is a saturated or unsaturated 6-membered ring or a fused ring containing carbon atoms as constituents of the ring, and the ring E forms a fused ring with the ring D;

(3)

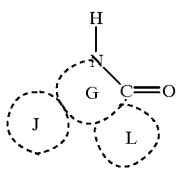

wherein G is a saturated or unsaturated 6- to 8-membered ring which optionally contains an oxygen atom as a constituent of the ring; and both J and L are independently a benzene ring, and the J and the ring L are independently form a fused ring with the ring G.

12. A resist composition according to claim 11, wherein the cyclic compound is an acid imide compound derived from an aliphatic dibasic acid, and is represented by formula (1).

13. A resist composition according to claim 12, wherein the acid imide compound derived from an aliphatic dibasic acid is succinimide, maleimide or glutarimide.

14. A resist composition according to claim 11, wherein the cyclic compound is an acid imide compound derived from an aromatic dibasic acid, and is represented by formula (2).

15. A resist composition according to claim 14, wherein the acid imide compound derived from an aromatic dibasic acid is phthalimide, 1,2,3,6-tetrahydrophthalimide, 1,8-naphthalimide or 2,3-naphthalenedicarboximide.

16. A resist composition according to claim 4, wherein the cyclic compound is pyromellitic acid diimide or bentazone.

17. A resist composition according to claim 5, wherein the compound is a sulfonamide derivative.

18. A resist composition according to claim 17, wherein the sulfonamide derivative is a compound represented by $R_0SO_2NHR'$ wherein $R_0$ is a substituted or unsubstituted alkyl group or a substituted or unsubstituted aryl group; and R' is a hydrogen atom or an alkyl group.

19. A resist composition according to claim 17, wherein the sulfonamide derivative is toluenesulfonamide, benzenesulfonamide or methanesulfonamide.

20. A resist composition according to claim 5, wherein the compound is a compound represented by the formula [21]:

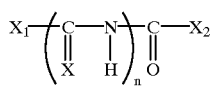

[21]

wherein $X_1$ and $X_2$ are independently a substituted or unsubstituted alkyl group or a phenyl group; n is an integer of 1 to 3; and X in a number of n are independently an oxygen atom or a sulfur atom.

21. A resist composition according to claim 20, wherein the compound of the formula [21] is N-benzoylbenzamide or diacetamide.

22. A method for reducing the substrate dependence of a resist which comprises incorporating a compound in the molecule containing at least one structure in which at least one of the direct links of —NH— is directly bonded to at least one member selected from the group consisting of —C(=O)—, —C(=S S)— and —SO$_2$— into a resist composition comprising a) a polymer capable of becoming alkali-soluble owing to the action of an acid, a compound capable of generating an acid upon irradiation with actinic radiation and a solvent capable of dissolving these three components, b) an alkali-soluble polymer, a compound capable of becoming alkali-soluble owing to the action of an acid, a compound capable of generating an acid upon irradiation with actinic radiation and a solvent capable of dissolving these four components, or c) an alkali-soluble polymer, a compound capable of making the polymer scarcely alkali-soluble by crosslinking therewith owing to the action of an acid, a compound capable of generating an acid upon irradiation with actinic radiation and a solvent capable of dissolving these four components.

23. A method according to claim 22, wherein the compound incorporated into the molecule is a cyclic compound.

24. A method according to claim 23, wherein the cyclic compound is pyromellitic acid diimide or bentazone.

25. A method according to claim 23, wherein the cyclic compound is represented by the following formula (1), (2) or (3):

(1)

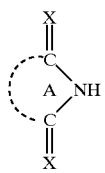

wherein X is an oxygen atom or a sulfur atom, and A is a saturated or unsaturated 5- or 6-membered ring which optionally contains an oxygen atom, a nitrogen atom, or a sulfur atom as a constituent of the ring, the carbon atoms constituting the ring optionally have substituents;

(2)

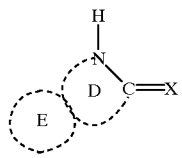

wherein X is an oxygen atom or a sulfur atom, D is a saturated or unsaturated 5- or 6-membered ring which optionally contains an oxygen atom, a nitrogen atom or a sulfur atom as a constituent of the ring, the carbon atoms constituting the ring optionally have substituents, the sulfur atom optionally has one or two oxo groups, and E is a saturated or unsaturated 6-membered ring or a fused ring containing carbon atoms as constituents of the ring, and ring E forms a fused ring with the ring D;

(3)

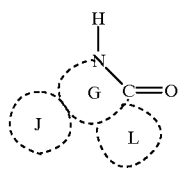

wherein G is a saturated or unsaturated 6- to 8-membered ring which optionally contains an oxygen atom as a constituent of the ring; both J and L are independently a benzene ring, and the ring J and the ring L independently form a fused ring with the ring G.

26. A method according to claim 25, wherein the cyclic compound represented by the formula (1) is an acid imide compound derived from an aliphatic dibasic acid.

27. A method according to claim 26, wherein the acid imide compound derived from an aliphatic dibasic acid is succinimide, maleimide or glutarimide.

28. A method according to claim 26, wherein the acid imide compound derived from an aliphatic dibasic acid is succinimide, maleimide or glutarimide.

29. A method according to claim 25, wherein the cyclic compound represented by the formula (2) is an acid imide compound derived from an aromatic dibasic acid.

30. A method according to claim 29, wherein the acid imide compound derived from an aromatic dibasic acid is phthalimide, 1,2,3,6-tetrahydrophthalimide, 1,8-naphthalimide or 2,3-naphthalenedicarboximide.

31. A method according to claim 29, wherein the acid imide compound derived from an aromatic dibasic acid is phthalimide, 1,2,3,6-tetrahydrophthalimide, 1,8-napthalimide or 2,3-naphthalenedicarboximide.

32. A method according to claim 20, wherein the compound incorporated into the molecule is a compound in which the group —NH— and the group or groups directly bound to the —NH— do not form a ring.

33. A method according to claim 32, wherein the compound is a sulfonamide derivative.

34. A method according to claim 33, wherein the sulfonamide derivative is a compound represented by $R_0SO_2NHR'$ wherein $R_0$ is a substituted or unsubstituted alkyl group or a substituted or unsubstituted aryl group; and R' is a hydrogen atom or an alkyl group.

35. A method according to claim 33, wherein the sulfonamide derivative is toluenesulfonamide, benzenesulfonamide or methanesulfonamide.

36. A method according to claim 32, wherein the compound is a sulfonamide derivative.

37. A method according to claim 36, wherein the sulfonamide derivative is a compound represented by $R_0SO_2NHR'$ wherein $R_0$ is a substituted or unsubstituted alkyl group or a substituted or unsubstituted aryl group; and R' is a hydrogen atom or an alkyl group.

38. A method according to claim 37, wherein the sulfonamide derivative is toluenesulfonamide, benzenesulfonamide or methanesulfonamide.

39. A method according to claim 32, wherein the compound is a compound represented by the formula (21):

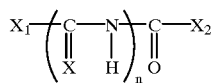

(21)

wherein each of $X_1$ and $X_2$ is independently a substituted or unsubstituted alkyl group or phenyl group; n is an integer of 1 to 3; and X in a number of n are independently an oxygen atom or a sulfur atom.

40. A method according to claim 39, wherein the compound represented by the formula (21) in N-benzoylbenzimide or diacetamide.

* * * * *

UNITED STATES PATENT AND TRADEMARK OFFICE
CERTIFICATE OF CORRECTION

PATENT NO. : 6,303,264 B1
DATED : October 16, 2001
INVENTOR(S) : Fujie et al.

It is certified that error appears in the above-identified patent and that said Letters Patent is hereby corrected as shown below:

Column 33,
Line 61, change "is an a compound in h the group" to be -- is a compound in which the group --

Column 34,
Line 52, change "of" to be -- to --
Line 56, change "ration" to be -- ratio --
Line 61, change "p-hydorxystyrene" to be -- p-hydroxystyrene --
Line 63, change "hydorxystyrene" to be -- hydroxystyrene --

Column 35,
Line 24, change "hydrostyrene" to be -- hydroxystyrene --
Line 34, change "ration" to be -- ratio --

Column 37,
Line 14, change "the J" to be -- the ring J --

Signed and Sealed this

Thirtieth Day of April, 2002

Attest:

Attesting Officer

JAMES E. ROGAN
Director of the United States Patent and Trademark Office